(12) United States Patent
Yang et al.

(10) Patent No.: US 9,866,170 B2
(45) Date of Patent: Jan. 9, 2018

(54) UTILITY-FRIENDLY HYBRID ENERGY CONVERSION SYSTEM FOR APPORTIONING CONCENTRATED SOLAR RADIATION IN REAL TIME UPON SELECTIVE DEMAND BETWEEN A PLURALITY OF SOLAR ENERGY CONVERSION DEVICES, INCLUDING A PHOTOVOLTAIC RECEIVER

(71) Applicant: MH GoPower Co., Ltd., Kaohsiung (TW)

(72) Inventors: Mei-huan Yang, Kaohsiung (TW);
Jonathan A. Jackson, Dayton, OH (US); Terry Zahuranec, North Olmsted, OH (US); Michael J. Creager, Brecksville, OH (US);
Remigio Perales, Oberlin, OH (US);
Cheng-Liang Wu, Kaohsiung (TW);
Chin-Wei Hsu, Zhongli (TW);
Chiun-Yen Tung, Kaohsiung (TW);
Ying-Jie Peng, Kaohsiung (TW);
Ping-Pang Lee, Kaohsiung (TW);
Mark J. Elting, Ossining, NY (US)

(73) Assignee: MH GOPOWER COMPANY LIMITED, Kaohsiung (TW)

( * ) Notice: Subject to any disclaimer, the term of this patent is extended or adjusted under 35 U.S.C. 154(b) by 411 days.

(21) Appl. No.: 14/308,715

(22) Filed: Jun. 19, 2014

(65) Prior Publication Data

US 2015/0372640 A1 Dec. 24, 2015

(51) Int. Cl.
*H02S 40/44* (2014.01)
*H02S 50/00* (2014.01)
(Continued)

(52) U.S. Cl.
CPC .............. *H02S 40/44* (2014.12); *F24J 2/14* (2013.01); *F24J 2/541* (2013.01);
(Continued)

(58) Field of Classification Search
CPC .... H01L 31/052–31/0525; H02S 20/30; H02S 20/32; H02S 40/20; H02S 40/22; H02S 40/40–40/44
See application file for complete search history.

(56) References Cited

U.S. PATENT DOCUMENTS

| 4,210,463 | A | * | 7/1980 | Escher | ................... F24J 2/0015 126/573 |
| 4,395,582 | A | | 7/1983 | Damsker | |

(Continued)

*Primary Examiner* — Eric R Smith
(74) *Attorney, Agent, or Firm* — Pearne & Gordon LLP

(57) ABSTRACT

Extremely fast dynamic control is allowed for hybrid PV/T (photovoltaic/thermal) distributed power production using concentrated solar power by manipulating the transmissive or reflective state of a capture element or mirror or lens that can pass highly concentrated solar light from one energy conversion device to another, such as a thermal collector and a photovoltaic receiver, such as a vertical multijunction cell array. This allows superior quality electrical backfeed into an electric utility, enhanced plant electrical production revenue, and responsiveness to a multitude of conditions to meet new stringent engineering requirements for distributed power plants. The mirror or lens can be physically articulated using fast changing of a spatial variable, or can be a fixed smart material that changes state. A mechanical jitter or variable state jitter can be applied to the capture element, including at utility electric grid line frequency.

24 Claims, 28 Drawing Sheets

FULL PV

(51) Int. Cl.
*H02S 20/30* (2014.01)
*H01L 31/054* (2014.01)
*F24J 2/14* (2006.01)
*F24J 2/54* (2006.01)
*F24J 2/18* (2006.01)

(52) U.S. Cl.
CPC .......... *H01L 31/0547* (2014.12); *H02S 20/30* (2014.12); *H02S 50/00* (2013.01); *F24J 2/18* (2013.01); *Y02E 10/45* (2013.01); *Y02E 10/47* (2013.01); *Y02E 10/52* (2013.01); *Y02E 10/60* (2013.01)

(56) References Cited

U.S. PATENT DOCUMENTS

| | | | |
|---|---|---|---|
| 4,746,370 A | 5/1988 | Woolf | |
| 4,746,371 A * | 5/1988 | McLeod | H01L 31/02005 136/244 |
| 5,374,317 A * | 12/1994 | Lamb | F24J 2/10 126/685 |
| 5,578,140 A | 11/1996 | Yogev et al. | |
| 6,029,656 A * | 2/2000 | Schwarz | F24J 2/07 126/634 |
| 7,994,417 B1 | 8/2011 | Fraas | |
| 8,097,803 B2 | 1/2012 | Chang et al. | |
| 8,669,462 B2 | 3/2014 | Almogy et al. | |
| 2005/0051205 A1 | 3/2005 | Mook, Jr. | |
| 2005/0173716 A1* | 8/2005 | Van Helden | H02S 40/44 257/98 |
| 2008/0000516 A1 | 1/2008 | Shifman | |
| 2008/0245412 A1* | 10/2008 | Uehlin | F24J 2/16 136/259 |
| 2010/0037934 A1 | 2/2010 | Chang et al. | |
| 2010/0319684 A1 | 12/2010 | Almogy et al. | |
| 2011/0036345 A1 | 2/2011 | Almogy et al. | |
| 2012/0279554 A1 | 9/2012 | Bostwick | |
| 2013/0008487 A1* | 1/2013 | Cheng | F24J 2/067 136/248 |
| 2013/0061910 A1 | 3/2013 | Almogy et al. | |
| 2013/0255750 A1 | 10/2013 | Escher et al. | |
| 2013/0255752 A1 | 10/2013 | Escher et al. | |
| 2013/0255753 A1 | 10/2013 | Escher et al. | |
| 2013/0265665 A1 | 10/2013 | Clavelle et al. | |
| 2013/0306139 A1 | 11/2013 | Bostwick | |

\* cited by examiner

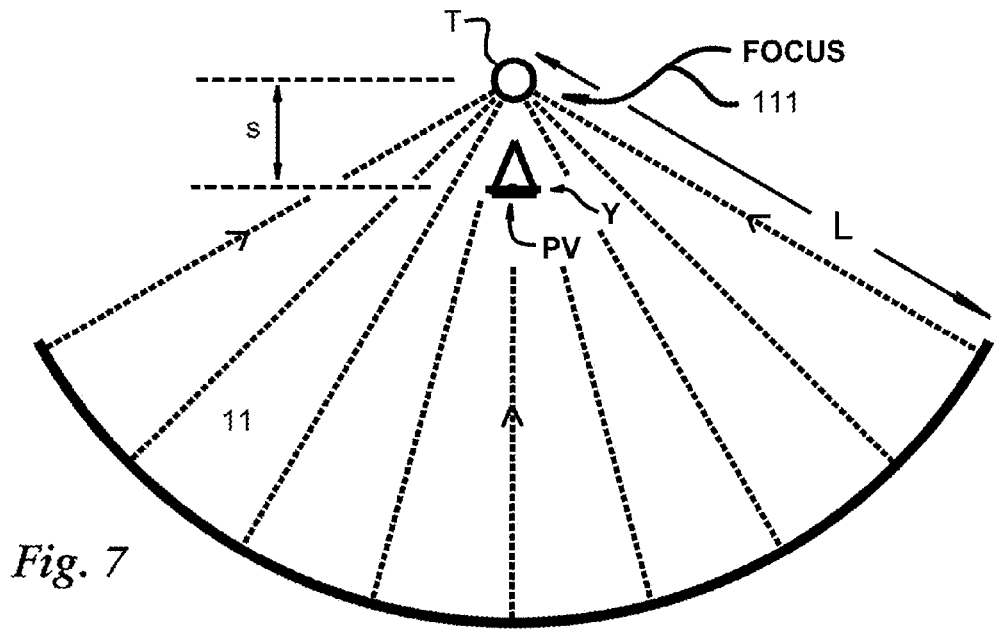
*Fig. 7*
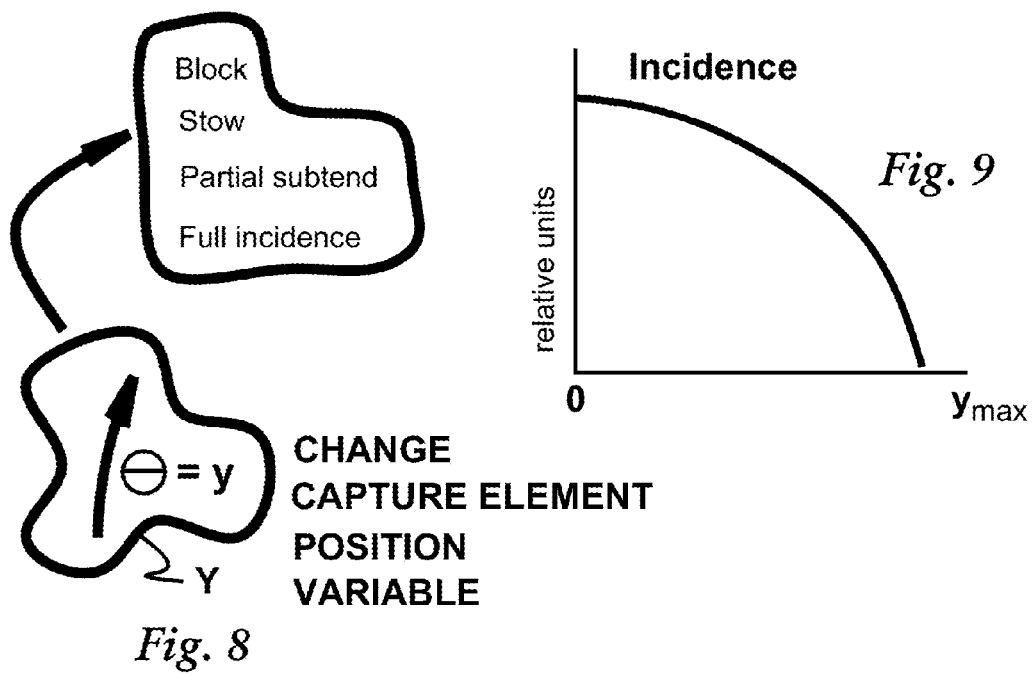
*Fig. 8*
*Fig. 9*

MOVEABLE CAPTURE ELEMENT

CAPTURE ELEMENT FIXED

T ONLY MODE

VARIABLE APPORTIONMENT

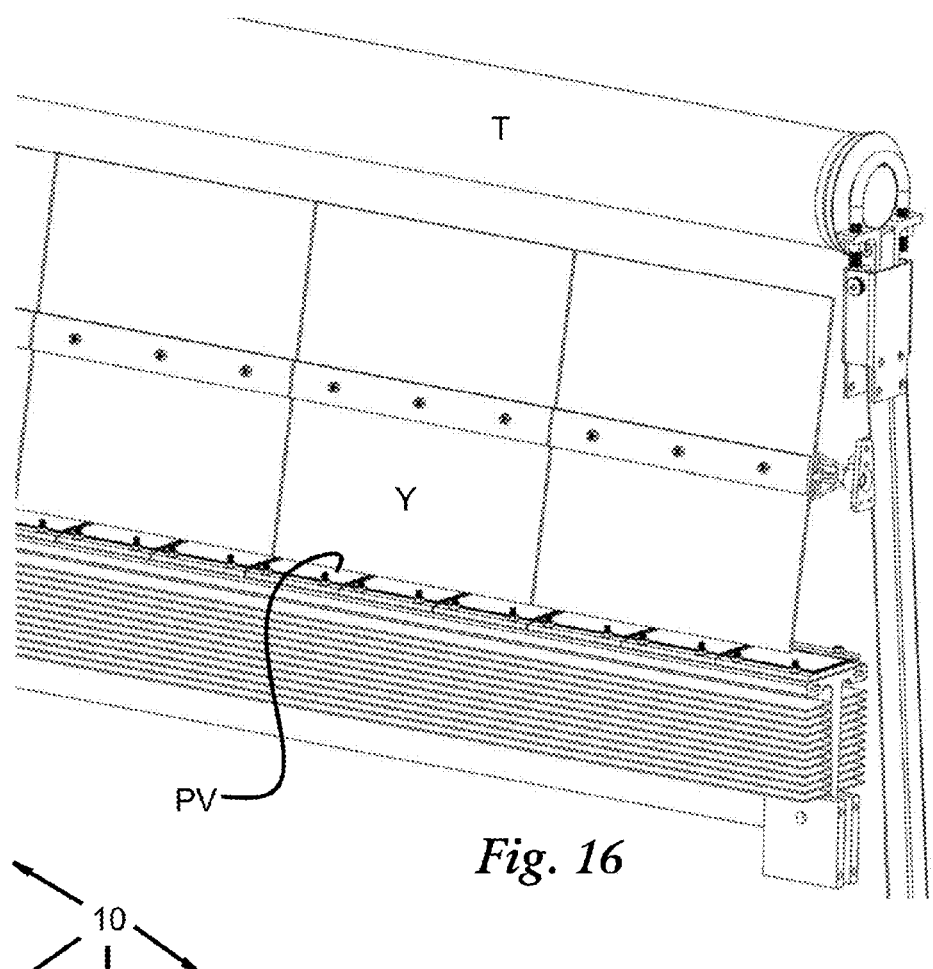
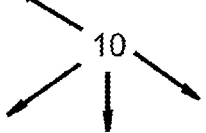
Fig. 16
CAPTURE ELEMENT STOWED
THERMAL ONLY

*Fig. 19*
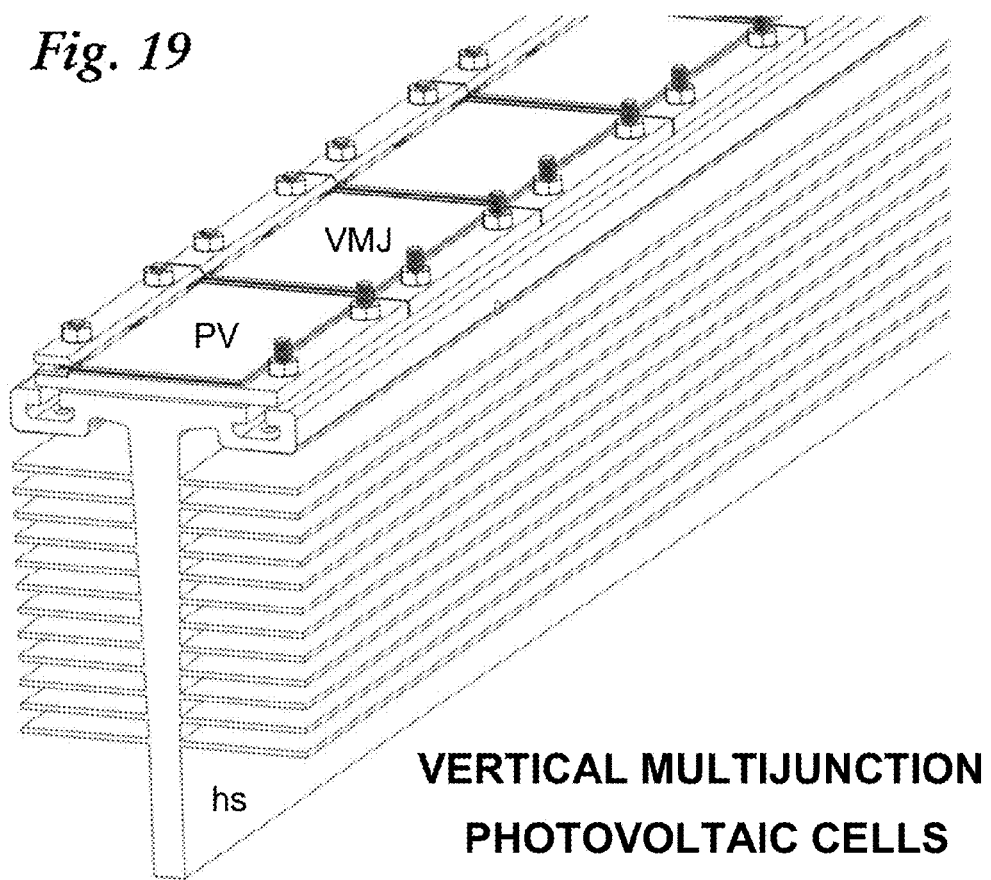
VERTICAL MULTIJUNCTION PHOTOVOLTAIC CELLS
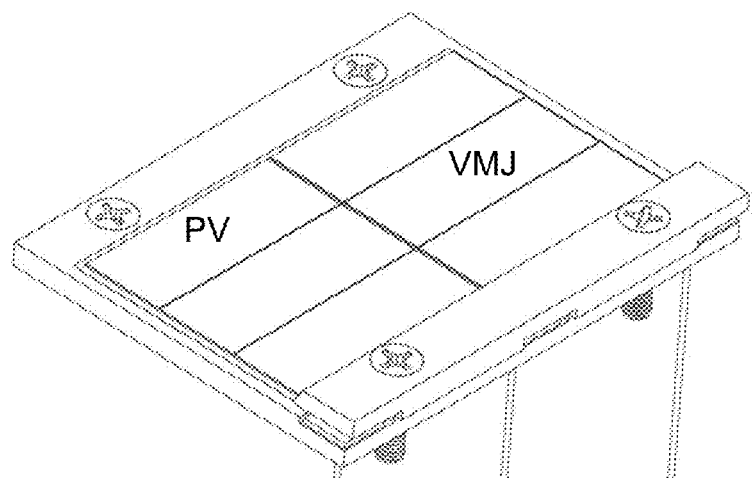
*Fig. 20*

FULL PV

THERMAL BLOCK

PV STOW

PARTIAL THERMAL BLOCK

MULTI-COMPONENT COLLECTOR TROUGH

APPLICATION OF JITTER TO
CAPTURE ELEMENT ANGLE VARIABLE y

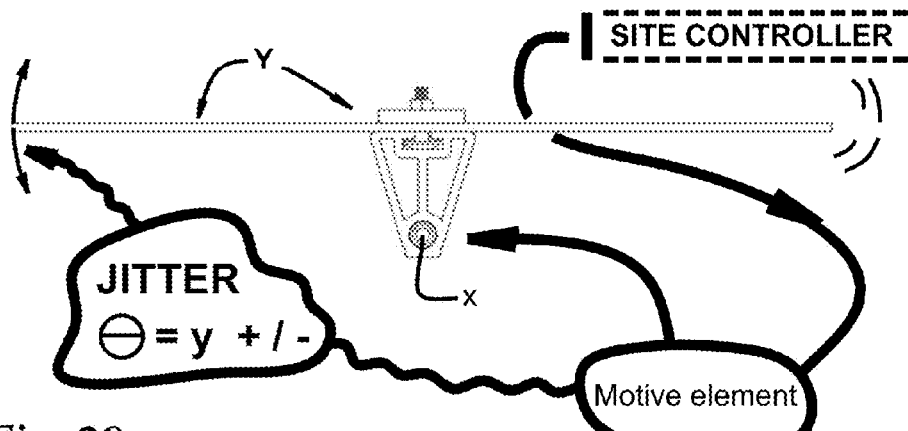
Fig. 29
**TWO STATE CAPTURE ELEMENT
CAPTURE ELEMENT FIXED**
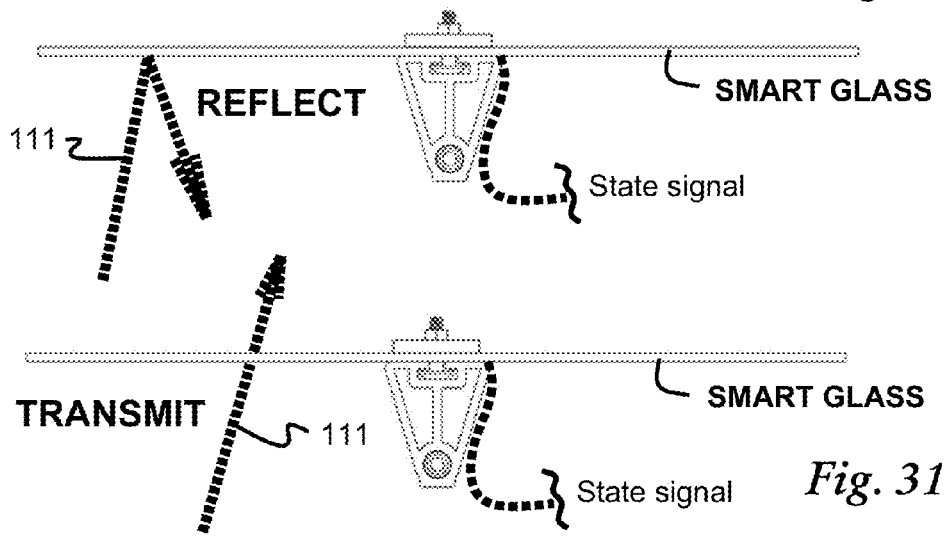
Fig. 30
Fig. 31

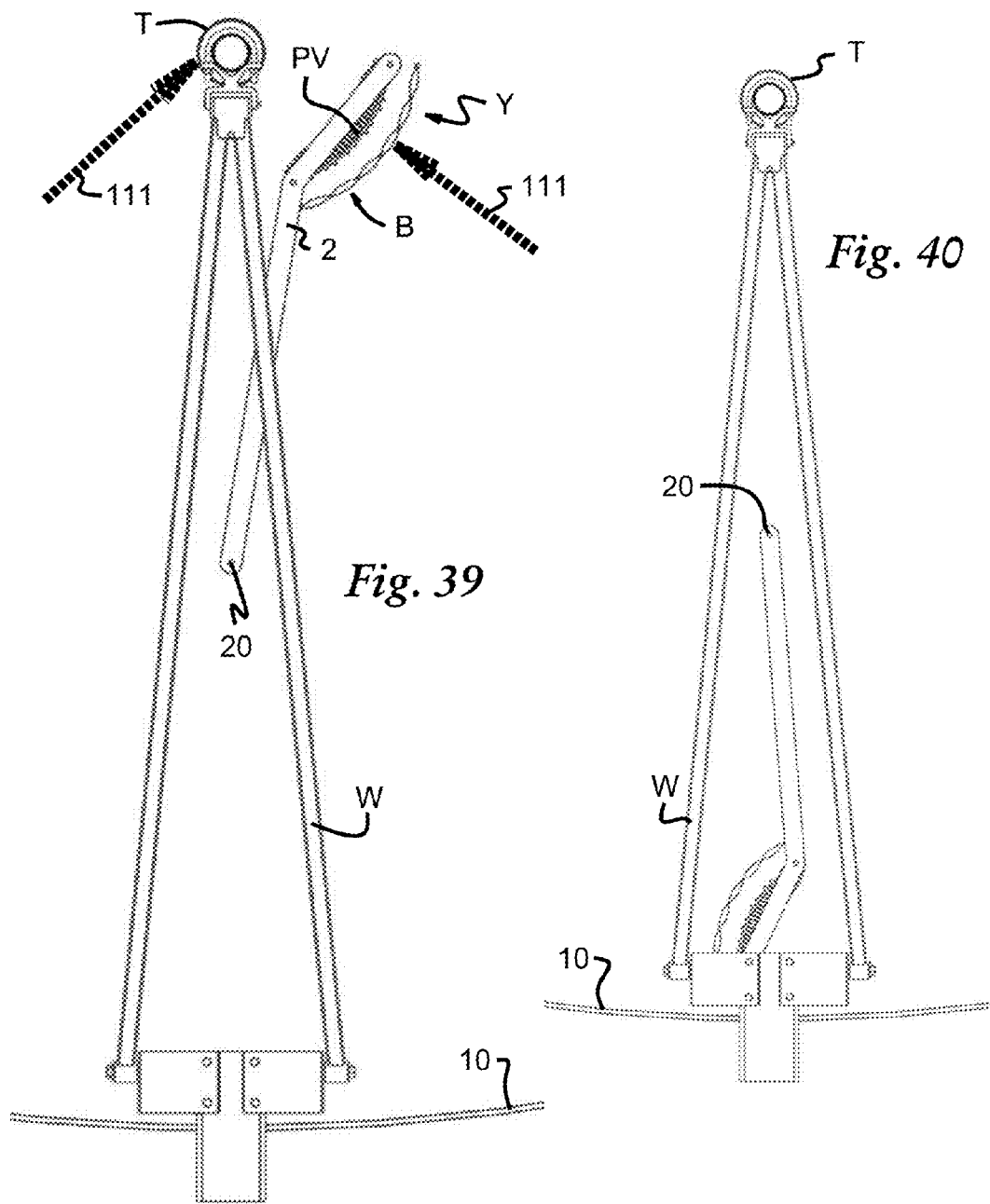

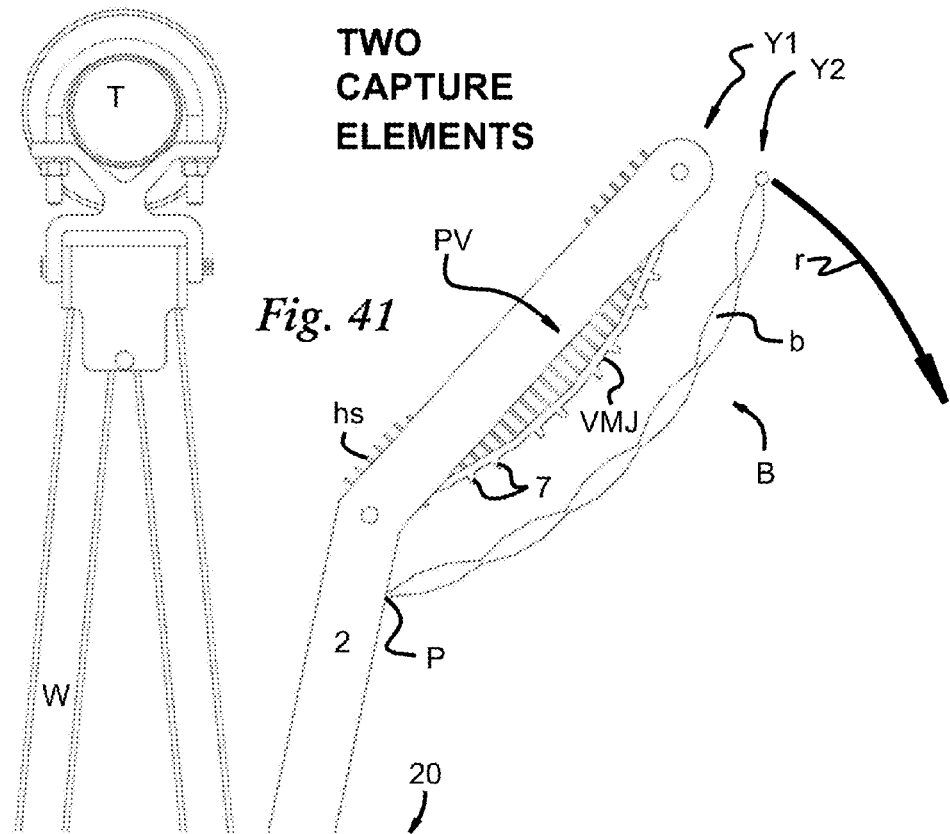
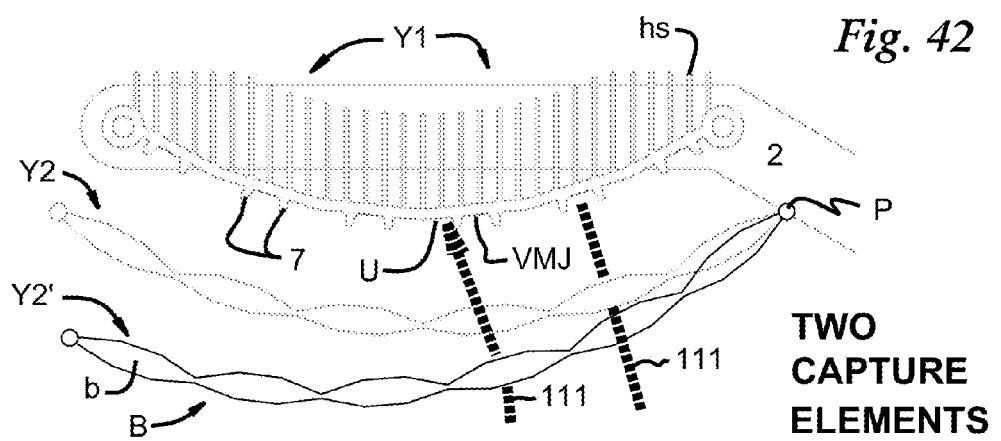

UTILITY-FRIENDLY HYBRID ENERGY CONVERSION SYSTEM FOR APPORTIONING CONCENTRATED SOLAR RADIATION IN REAL TIME UPON SELECTIVE DEMAND BETWEEN A PLURALITY OF SOLAR ENERGY CONVERSION DEVICES, INCLUDING A PHOTOVOLTAIC RECEIVER

TECHNICAL FIELD

This invention relates to hybrid concentrated solar power generation plants, sometimes known as thermophotovoltaic plants, that use both concentrated solar power (CSP) such as those that use traditional parabollic trough plants, combined with concentrated photovoltaics.

More specifically, it relates to hybrid PV/T (photovoltaic/thermal) energy conversion systems that are typically part of cogeneration or other local power production systems, or are using distributed solar power generation systems that backfeed into electric utility power grids.

Preferred embodiments shown demonstrably herein include split-spectrum concentrated solar power conversion systems that use high input energy vertical multi-junction photovoltaic cells and thermal trough collectors, and are adjustable for regulated and apportioned output to meet urgent, new and evolving engineering requirements.

BACKGROUND OF THE INVENTION

Hybrid photovoltaic/thermal distributed power generation systems are fast becoming of new international importance as a fast growing segment in newly added power production, with intense research, development, installation and study efforts ongoing worldwide.

The use of concentrated solar power has a long history. The Greek mathematician, engineer and inventor Archimedes was said to have used what amounted to solar concentrators to bring incineration upon the invading Roman fleet of Marcus Claudius Marcellus in Syracuse in 212 BC. Concentrating solar power to produce heating and light effects continued throughout the Middle Ages.

Present day concentrated solar power (CSP) energy conversion systems use mirrors or lenses to concentrate a solar light onto a small area, yielding a number of well-known cost and efficiency and energy density advantages. If electrical power is desired, the concentrated light can be converted to high heat, and used to drive a heat engine, such as a steam turbine, that exploits a Carnot-family thermodynamic cycle process, such as Rankine and Stirling processes, as known in the art.

Such thermoelectric installations have spread around the world, with large installed capacities coming on line this past decade. Most of these plants are parabolic-trough plants, which concentrate light for impingement onto thermal tubes or collectors that contain a heat transfer medium. Large scale CSP plants achieve overall energy conversion efficiencies of approximately 17 percent. CSP plants, in order to meet engineering requirements for safety and longevity of the turbines or conversion equipment to which they are connected, often have to dump excess thermal energy, rather than use it for conversion. This is often done by judicious movement of solar tracking of the collector troughs, or by blocking or covering the thermal pickup(s).

CSP systems are distinct from concentrated photovoltaics (CPV). In CPV, the concentrated sunlight is converted directly to electricity via the photovoltaic effect. In either case, the characteristics of sunlight incident upon a converter are determinative.

Now referring to FIG. 1, a cartesian plot of both unfiltered solar radiation and net (ground) solar radiation is shown, with spectral radiance in watts per square meter per nanometer versus wavelength in nanometers (nm). Approximately seven percent of the electromagnetic radiation emitted from the sun is in a UV range of about 200-400 nm wavelengths. As the solar radiation passes through the atmosphere, ultraviolet or UV radiation flux for shorter wavelengths is reduced, absorbed in large part by atmospheric gases and stratospheric ozone, with a small amount transmitted to the Earth's surface. Solar UV-A radiation from 320-400 nm is essentially, for practical purposes, not absorbed by the ozone layer. As can be seen, a large span of wavelengths are present in a particular distribution in solar light. New efficient solar energy conversion systems very often use varied internal conversion components, and often operating strategies, for converting the various wavelength fractions as shown.

Photovoltaic energy conversion of visible light fractions typically makes use of the photovoltaic effect. Solar cells use this effect inside what are usually traditional solid-state semiconductors, formed by single or multiple lattices of semiconductor crystals with two alternating type of dopants—those doped with n-type impurities to form n-type semiconductors, which provide a free population of conduction band electrons, and those doped with p-type impurities to form p-type semiconductors, which add what are called electron holes. Electrons flow across the lattice boundaries to equalize the Fermi levels of the two differently doped materials. This results in what is called charge depletion at the interface, called the p-n junction, where charge carrier populations are depleted or accumulated on each side.

Sunlight can cause photo excitation of electrons on the p-type side of the semiconductor lattice, which can cause electrons from a lower-energy valence band to pass into a higher-energy conduction band. These electrons, after subtracting various energy and charge carrier losses, can do work across an electrical load as they flow out of the p-type side of the lattice to the n-type side. The result is a known and mature direct energy conversion process which offers relatively high conversion efficiencies, especially if light of selected wavelengths is selected for absorption.

Recently, energy efficiencies have gone up via a newer type of lattice construction using multiple junctions which are custom fabricated using different semiconductor materials and dopants to operate efficiently for selected wavelengths. Development of these and other enhanced photovoltaic technologies, such as vertical multijunction (VMJ) photovoltaic cells, offer promise for concentrated solar photovoltaics. In a photovoltaic device, each semiconductor or other material can create a p-n junction or interface that produces charge carrier current in response to a select distribution of wavelengths of light. Such multijunction photovoltaic cells provide optimal light-to-electricity conversion at multiple or select wavelengths of light, which can increase overall energy conversion efficiency. Traditional single-junction cells have a maximum theoretical efficiency of 34%. Theoretically, multijunction photovoltaics have a maximum theoretical efficiency in excess of 50% under highly concentrated sunlight. In addition, high voltage silicon vertical multijunction photovoltaic solar cells made using recently developed fabrication techniques are ideally suited for beam-split concentrated light applications, as they are capable of conversion of light intensities of tens or hundreds or thousands of suns intensity AM1.5.

Structurally, VMJ cells are an integrally bonded series-connected array of miniature silicon vertical unit junctions. They offer design simplicity, low cost, and an innovative edge-wise entry for light that allows for easy and controlled absorption and conversion at the high energy levels produced by hybrid concentrated solar power. Their higher per-unit cost relative to single junction photovoltaics can be more than justified by their ability to handle and convert concentrated solar power and the high voltage they produce is more compatible electrically with conditioning systems that prepare the photovoltaic power for use upstream or for backfeeding into electrical utility transmission networks.

In forming hybrid systems, known beam splitting between thermal and and photovoltaic receivers is known in the art and has been a big factor driving hybrid energy conversion, as the lower frequency fractions of sunlight are typically used to drive thermally based processes, and the higher frequency fractions, namely, visible light and high energy infrared—are used to power photovoltaic systems. When used in this manner, overall energy conversion efficiencies of VMJ photovoltaic cells such as those made by MH Solar Co. (Kaohsiung City, Taiwan) can approach and surpass 35% when used to convert light from 400 nm to 1100 nm, rather than full received solar radiation, which includes background and longer wavelength infra-red light.

In forming hybrid PV/T systems that process separately the thermal and mostly visible portions of the solar spectrum, the prior art makes use of adaptive concentrators that can change the relative amount of received solar energy devoted to thermal versus photovoltaic uses.

For example, US Publication 2013/0255753 to Escher discloses a photovoltaic thermal hybrid system wherein a photovoltaic module and/or a thermal collector are moveably mounted. One method disclosed involves instructing a positioning mechanism to move the photovoltaic module and/or the thermal collector to change operatively a ratio of an intensity of radiation received at the photovoltaic module to that received at the thermal collector. This system, however is cumbersome, requiring a high ratio of moving components to solar energy collected, and is slow to react and change, which is a consideration discussed below.

The planning, design, adoption, regulatory approval for, and utility approval for the use and installation of hybrid PV/T solar energy conversion systems are all evolving. Aside from land use and environmental considerations, high capital costs and especially local utility grid infrastructure and engineering requirements are fast becoming major issues for the success and acceptance of such systems, particularly for those where backfeeding of electricity produced to generate revenue is expected to be significant.

Now referring to FIG. 2, a plot of spectral direct irradiance versus time for a typical sample summer day is shown in a cartesian plot. As can be seen from this plot over less than one hour time, large variations are the norm in incident light power, due to passage of clouds and haze and other atmospheric variations and photovoltaic power generation levels behave accordingly. These considerations are discussed in US Publication 2008/0295883 to Ducellier et. al., incorporated by reference herein in its entirety.

Many smaller distributed solar power generation systems have no storage capacity, and are typically used in residential homes and small businesses to either decrease the apparent load imposed on the electric utility, or there is what amounts to a purchase of excess energy by the utility, with backward metering, possibly with the electric billing meter spinning backwards, if mechanically based.

Many large commercial hybrid distributed power generation systems, have storage capacity for thermal energy produced, and backfeed local electrical utility electrical transmission lines for revenue generation, making use of metering agreements with utilities that can include net or reverse metering, TOU (Time of Use) metering or buy-back rates for electricity produced and sold to the utility. In buying power from distributed solar energy conversion plants, time-of-use rates often apply, and the utility often reduces the revenue by demand charges that may be assessed, as well as miscellaneous charges for reactive power being backfed into the electrical grid. All such distributed power generation systems back-feeding power into central or network electrical utilities must meet many engineering requirements and endeavor to help provide and maintain a stable electrical transmission grid, free from brown-outs, power outages, and electric waveform spikes and other abnormalities.

Many utility connected distributed solar power generation systems produce DC (direct current) voltages in excess of 300 volts before being transformed into inverted AC (alternating current) waveforms using known inverters. A proper AC waveform output from distributed power generation systems is needed for compatibility with the world's electrical power and transmission systems, and to enhance safety, because the fire hazards of DC circuits are great. For a given power level, a DC arc is harder to extinguish and causes more damage more quickly.

At central electrical utilities, a grid operator endeavors to match on-line generation capacity to customer electrical load at any given moment. The grid operator controls the deployment and call for generation output from all power producing assets, including network high voltage transmission lines to other utilities, to provide for electrical needs during load swings throughout the day. The recent additions worldwide of renewable energy generation technologies such as solar and wind power creates a class of power generation assets which relatively speaking, cannot be controlled or scheduled in the same way.

Naturally, there are requirements that must be met before any distributed generation plant can be allowed to be connected to a utility transmission grid. One such requirement is known as an anti-islanding provision. Islanding is undesirable creation of an island of distributed generation equipment that is attempting to power a grid location even though centralized electrical utility power is no longer present. To address this, universally there are line voltage monitoring systems in PV inverters/controllers that make sure that a photovoltaic system does not attempt to feed dead circuitry, to protect line personnel and others from the dangers of a back-feed onto the utility grid system upon utility power failure, circuit fault, or planned shut-down. This kind of safety requirement is actually part of a much larger set of strict engineering requirements imposed upon distributed power generation systems, including hybrid systems that are the subject of this disclosure. These requirements are codified in regulatory standards and codes, and more specifically in engineering policy at electrical utilities, and usually guided further by utility field engineering departments that have a yes or no say in approvals of new energy producing assets that will backfeed into their power networks.

In the United States the National Electrical Code has well-developed provisions like Article 690, which relate to safety of solar photovoltaic systems. Localities also typically reserve the right to check photovoltaic backfed power quality, including measurement of unwanted secondary, tertiary, and higher order harmonics that can cause electromagnetic interference, component overheating, low power factor and component and customer equipment failure. Harmonic electrical injection, including THD (Total Harmonic Distortion) into a grid is often limited to levels as stipulated in IEEE (Institute of Electrical and Electronics Engineers) Standard 519-1992. Other general standards include IEEE Standard 929-2000, entitled, IEEE Recommended Practice for Utility Interface of Photovoltaic (PV) Systems, covering anti-islanding, safety, and power quality, as well as provisions promulgated by testing and certification organizations, such as Underwriter's Laboratories (UL) Standard 1741, entitled, Inverters, Converters, Controllers and Interconnection System Equipment for Use With Distributed Energy Resources.

Furthermore the Energy Policy Act of 2005 established IEEE Standard 1547, Standard for Interconnecting Distributed Resources with Electric Power Systems, as a national standard in the United States.

These standards, as well as well-established engineering practice address other problems. Part of IEEE Standard 1547 addresses frequency drift, and mandates obligatory overfrequency disconnection at 60.5 Hz, and underfrequency disconnection at 59.3 Hz. The subject matter of this engineering is to handle adverse phenomena that occur and change from moment to moment.

The imposition of engineering standards that can doom the future of a hybrid distributed power generation plant can even be used to serve other objectives. There is an economic disincentive for electrical utilities to make large numbers of approvals for proposed distributed (independent) solar generation facilities, because, in part, the buybacks or purchases of power from these independent facilities provide negative capital flow without a proportionate contribution to cost of the transmission line infrastructure to which they connect. Traditional CSP plants are facing declining favor in the eyes of electrical utilities because of lack of controls over their production, which can exhibit choppy, intermittent, or even insidious mass-oscillating backfeed power levels. Utilities produce what is called a base production using large, cost-efficient, highly controlled and predictable power producing assets, such as hydroelectric or production or fuel-powered turbines which drive large generator sets. They typically supplement this with power purchased minute-by-minute from neighboring utilities, and with more expensive supplemental power generating assets.

Intermittent sources of electricity such as traditional flat panel single junction photovoltaics are difficult for utilities to manage. The fast changing supply into local transmission lines varies and can create a grid instability should excess capacity be forced on the grid.

In this disclosure, acceptance by utilities and meeting local in-place engineering requirements for both backfeeding electrical power and local cogeneration figure importantly. Those engineering requirements are numerous and stringent, driven in part by:

[1] Cloud passage, which causes introduction of significant amounts of fast-changing intermittent power generation added to the base load of a utility. This can affect operational controls across huge regions and can increase the need for what historically has been known as spinning reserve, where electromechanical power production assets must possess undue elasticity to meet demand fluctuations, reducing operating efficiency and increasing operating costs, by running more equipment than strictly necessary under ordinary operating conditions, or by running equipment faster or with greater torque than otherwise needed.

[2] Islanding, especially if there is large distributed power capacity in a particular region or neighborhood, as those systems provide a false reading of line voltage and continue to provide power after a utility fault or shutdown. IEEE Standard 1547 mandates that distributed solar power generation system inverters disconnect if there is a sagging voltage condition. However, since loads are not automatically disconnected, this may cause an increase in central utility demand to make up for the lost power, aggravating voltage sag perhaps further and leading to pre-blackout or blackout conditions, such as where a nominal 120 volts or 240 volts to ground residential service goes down to 108 or 216 volts, respectively as a result of these dynamic events.

[3] Insidious mass phenomena, as large numbers of individual distributed power generation systems can effectively work together in unintended ways, with slightly different backfed power frequencies combining using constructive and/or destructive interference, and triggering a non-linear oscillator on a grand scale that could wreak havoc with utility operations and equipment and damage customer assets as well.

[4] Escalation of short circuit or fault currents, as the addition of distributed power generation systems can add to fault current values, causing unplanned destruction of utility property and lines.

[5] Insidious action of utility fault current relays, as strange behaviors are induced. Electric utility fault relays have a certain protocol that gets triggered by detecting a circuit fault, such as when a tree branch causes two overhead phase conductors to touch. Typically there is a disconnect period to allow the fault to clear. If inverters remain online, for lack of responsiveness or any other reason, those inverters and associated controllers can get damaged during a fault current relay reconnect. Alternatively, the inverters may continue to supply current, which could maintain the circuit fault, causing the utility fault current relays to lock open or go into permanent cut-out. During that time, the inverter may continue energizing utility phase lines, causing a dangerous condition for customer equipment and a possible danger to utility line maintenance personnel.

[6] Distributed power generation systems as presently configured cause problems with voltage and current regulation. Utility voltage regulators measure current and voltage and will boost voltage to insure proper delivery standards are met after taking into account voltage drop in proportion to power flow. Introduction of a distributed solar power facility tends to distort the regulation scenarios, boosting impoperly delivered line voltage to surrounding customers, while potentially lowering customer line voltage if the regulation systems are being shown voltages boosted by injection of photovoltaic or solar-provided power.

[7] Fuses, cut-outs, circuit breakers and inductive limiters are all designed to protect utility lines, but injection of distributed power generation will not perhaps be detected, adding to overload potential.

[8] Phase-to-neutral voltages can spike, especially with load generation imbalance, with a robust solar distributed power generation station that is not equipped to react in a timely manner to prevent over-voltage, because present-day systems are limited in their dispatchability and/or interactive control capability.

One problem is that because energy production systems are naturally designed to be useful over a wide range of possible insolation levels, including seasonal variations, there often come times or operating conditions that warrant "dumping" excess power, either at the communicated or prior request of a local electric utility, or to protect on-site equipment or property.

Now referring to FIG. 3, a rough schematic representation of one prior art energy dump procedure for a hybrid photovoltaic/thermal distributed power generation plant is shown. As shown, a collector tracking angle or other similar parameter as known by those skilled in the art is changed (Change Collector Tracking Angle) which provides a defocus or other reduction in a concentrated solar beam (Defocus Concentrated Beam) and causes the plant to reduce solar input, shown, Reduce Solar Incidence. This practice is common, but wasteful and not adequately responsive to meet new engineering requirements.

As will be discussed, the shut-off or apportionment upon intelligent demand the energy flows from the thermal and/or the photovoltaic sources in a hybrid distributed power generating station can result in higher energy production from a set amount of solar input, and can alleviate or eliminate many adverse phenomena, allowing for increased acceptance by and compatibility with electric power utilities.

One objective of the instant invention is to provide dispatchability and fast, selective, on demand, interactive control capability that meets engineering objectives as discussed above. Other objectives include higher overall energy conversion efficiencies, higher revenue generation from backfed power, and other objectives, as will be evident reading the appended description.

SUMMARY OF THE INVENTION

The invention allows major control over the apportionment and other major aspects of the nature of hybrid PV/T distributed power production by manipulating the state of a capture element. The systems contemplated by the instant invention can allow an electric utility to control by proxy this manipulation and can produce what amounts to a qualitatively different type of hybrid PV/T power production.

The invention can comprise a hybrid energy conversion system for apportioning concentrated solar radiation in real time upon selective intelligent demand between a plurality of solar energy conversion devices, including a photovoltaic receiver, where the system comprises a collector trough so sized, positioned, oriented and shaped to concentrate the solar radiation to create a concentrated angular distribution of light, with the concentrated angular distribution of light possessing a focal length and/or a delivery length, as measured from a surface of the collector trough to a relative maximum of highly concentrated solar light formed thereby; a first solar energy conversion device selected from a thermal collector, and a photovoltaic receiver, so formed, sized, shaped, positioned and oriented to receive at least some of the solar radiation from the collector trough via the highly concentrated solar light in the concentrated angular distribution of light; a selectively deployable capture element so formed, sized, shaped, positioned and oriented to capture selectively on demand at least some of the concentrated angular distribution of light for any of reflection to, partial reflection to, direction to, or conversion by, a second solar energy conversion device selected correspondingly from the other of a photovoltaic receiver and a thermal collector; and with the capture element so articulatably formed as to be selectively deployable for light capture by either transitioning at least one optical property selected from reflectivity and transmissivity, or simply gross modulation across a spatial variable comprising at least one of a capture angular range and a capture translational range.

Such a system can preferably be so formed that the capture element is so sized, shaped, positioned and oriented to be able to be selectively positioned within a short path length from a relative maximum in the concentrated angular distribution of light, the short path length being of magnitude less than 0.45, or more preferably less than 0.25, or more preferably less than 0.15, of the focal length or delivery length associated with the collector trough.

Optionally, the capture element can be so operatively positioned to deliver upon the second solar energy conversion device a deflected highly concentrated solar light.

The photovoltaic receiver can comprise at least one multijunction photovoltaic cell or receiver, and can preferably comprise at least one vertical multijunction photovoltaic cell.

Optionally, the capture element can be so formed to capture the concentrated angular distribution of light sufficiently to cause substantially all solar light incident upon it to be deflected to the second solar energy conversion device.

Preferably, the thermal collector is a thermal tube positioned at or near a focal length of the collector trough.

Smart glass can preferably be used as part of the capture element, with the smart glass so operatively formed in such a way, to allow transitioning between optical states, such near fully reflective and near fully transmissive.

An alternate embodiment can be made where the selectively deployable capture element is so formed, sized, shaped, positioned and oriented to capture selectively on demand at least some of the concentrated angular distribution of light for conversion by a second solar energy conversion device selected correspondingly from the other of a photovoltaic receiver and a thermal collector, but where the capture element comprises operatively the second solar energy conversion device, e.g., a photovoltaic receiver. The capture element can thus also be so articulatably formed as to be selectively deployable for light capture by either transitioning at least one optical property selected from reflectivity and transmissivity, or simply gross modulation across a spatial variable comprising at least one of a capture angular range and a capture translational range. In this way, the capture element can be articulated or its state can still be modulated at will.

The invention also comprises a method for operating a hybrid energy conversion system for apportioning a concentrated angular distribution of light in real time upon selective intelligent demand between a plurality of solar energy conversion devices, including a photovoltaic receiver, the method comprising:

[1] positioning a first solar energy conversion device selected from a thermal collector, and a photovoltaic receiver, to receive at least some of the concentrated angular distribution of light;

[2] positioning a selectively deployable capture element to capture selectively on demand at least some of the concentrated angular distribution of light for any of reflection to, partial reflection to, direction to, or conversion by, a second solar energy conversion device selected correspondingly from the other of a photovoltaic receiver and a thermal collector;

[3] articulating the capture element to be selectively deployable for light capture by at least one of transitioning at least one optical property selected from reflectivity and transmissivity; and gross modulation across a spatial variable comprising at least one of a capture angular range and a capture translational range.

Additionally the method can comprise using the selective capture any of:
[a] diversion of the concentrated angular distribution of light onto the photovoltaic receiver to remove a corresponding amount of the concentrated angular distribution of light from the thermal collector, and
[b] and diversion of the concentrated angular distribution of light away from the photovoltaic receiver to add a corresponding amount of the concentrated angular distribution of light to the thermal collector, where corresponding shall be interpreted to allow for incidental light losses.

Additionally, the method can also comprise effecting either of these diversions [a] and [b] as a result of a command decision that considers an input selected from any of an advanced rate metering input; a system operator input; a transactive signal; a circuit fault detection input; a line voltage input; a backfeed level input; a power grid substation high voltage signal; an islanding detection signal; a power factor level signal; a peak demand shaving signal; an electrical line frequency monitoring signal; a harmonics detection signal; a signal indicating that no power grid backfeeding is permitted; a utility line worker over-ride signal; a signal from a smart load fed at least selectively by the thermal collector; and a signal from a turbine system fed at least selectively by the thermal collector.

One can also apply a mechanical jitter to the capture element with the mechanical jitter optionally possessing at least one frequency selected from a fraction and a multiple of a power grid line frequency, including unity. Alternatively, one can also modulate the selective capture of the capture element by applying a variable state jitter to the capture element to influence the transitioning, such as where the reflectivity and the transmissivity of the smart glass can be modulated by an electrical signal, state signal or other signal.

The method can also comprise operating a hybrid energy conversion system for apportioning a concentrated angular distribution of light in real time upon selective intelligent demand between a plurality of solar energy conversion devices, including a photovoltaic receiver, and using using capture elements that themselves comprise photovoltaic receivers, the method comprising:
[1] positioning a first solar energy conversion device selected from a thermal collector, and a photovoltaic receiver, to receive at least some of the concentrated angular distribution of light;
[2] positioning a selectively deployable capture element to capture selectively on demand at least some of the concentrated angular distribution of light for conversion by a second solar energy conversion device selected correspondingly from the other of a photovoltaic receiver and a thermal collector;
[3] articulating the capture element to be selectively deployable for light capture by at least one of transitioning at least one optical property selected from reflectivity and transmissivity; and gross modulation across a spatial variable comprising at least one of a capture angular range and a capture translational range.

Similarly the diversions [a] and [b], along with the mechanical and/or variable state jitter can be applied to this second method.

Two or more capture elements can be used in concert, such as with light passing from one to another, in service of the instant invention.

BRIEF DESCRIPTION OF THE DRAWINGS

FIG. 7 shows the rough schematic of FIG. 5, and showing placement of a thermal collector, and a capture element that comprises a photovoltaic receiver;

FIG. 8 shows a rough schematic representation of possible effects of change of a capture element position variable according to the invention;

FIG. 9 shows a very rough cartesian plot demonstrating a possible dependence of incidence allowed by a capture element on a capture element position variable;

FIG. 16 shows a close-up oblique view similar to that of FIG. 14, showing the bottom active face of the capture element, and with the capture element stowed for thermal production only;

FIG. 19 shows one possible photovoltaic receiver for an embodiment according to the invention employing an array of vertical multijunction photovoltaic cells thermally coupled to a heat sink;

FIG. 20 shows an oblique surface view of a sub-array of the vertical multijunction photovoltaic cells of FIG. 19;

FIG. 29 shows close-up side cross-sectional view of a capture element according to the invention similar to that shown in FIG. 6, with the capture element under the control of a site controller via a motive element administering mechanical jitter;

FIGS. 30 and 31 show close-up side cross-sectional view of a capture element according to the invention similar to that shown in FIG. 6, with two-state smart glass exhibiting reflective and transmissive behaviors used by an alternative preferred embodiment taught by the instant invention;

FIG. 39 shows a partial cross-sectional, partial surface view of a hybrid energy conversion system using the planetary capture element with sub-concentrator depicted in FIGS. 35-38, receiving light and with a planetary capture element supported illustratively on a swing arm;

FIG. 40 shows a partial cross-sectional, partial surface view of the hybrid energy conversion system using the planetary capture element with sub-concentrator depicted in FIG. 39, but with the planetary capture element swung into an inactive or stow position;

FIG. 41 shows a partial cross-sectional, partial surface close-up side view of the top of a different hybrid energy conversion system using the planetary capture element with sub-concentrator, similar to that depicted in FIGS. 35-40, but employing a second capture element in the form of an articulatable sub-concentrator lens; and FIG. 42 shows a close-up cross-sectional view of the side of the hybrid energy conversion as illustratively depicted in FIG. 41, showing the planetary capture element receiving two different illustrative light rays of highly concentrated solar light arising from two different states of the second capture element.

DEFINITIONS

The following definitions shall be used throughout:

Capture angular range—shall denote the portion of the angular range of the concentrated angular distribution of light subtended by a capture element that is positioned as contemplated by the instant invention.

Capture element—can comprise any of [1] a mirror, as defined herein, any lens; cold or hot mirror, dichroic element, long (wavelength) pass mirror, or short (wavelength) pass mirror, which can reflect, redirect, or selectively concentrate any amount or all of a concentrated angular distribution of light to a solar energy conversion device upon selective demand; or [2] a solar energy conversion device so formed and positioned to perform direct capture of the concentrated angular distribution of light upon selective demand. A capture element can comprise smart glass as taught by the instant invention. Capture elements as contemplated by the invention can upon selective demand cause a redirecting, reflecting, or re-concentration of light to a solar energy conversion device, or alternatively, operate to capture, upon selective demand, light for conversion by a solar energy conversion device. Thus, broadly, a capture element either selectively redirects light for capture by a solar energy conversion device, or itself selectively operates selectively to capture light for solar energy conversion. In this way, a given component such as a lens array can itself become a capture element if it is endowed with the ability to vary selectively the amount of light impinging upon a photovoltaic cell, such as illustratively shown in FIGS. 41 and 42.

Capture translational range shall denote that portion of a linear spatial or translational range of a capture element formed and positioned according to the instant invention that allows for variable incidence of a concentrated angular distribution of light upon a solar energy conversion device such as a photovoltaic receiver.

Figure 26:
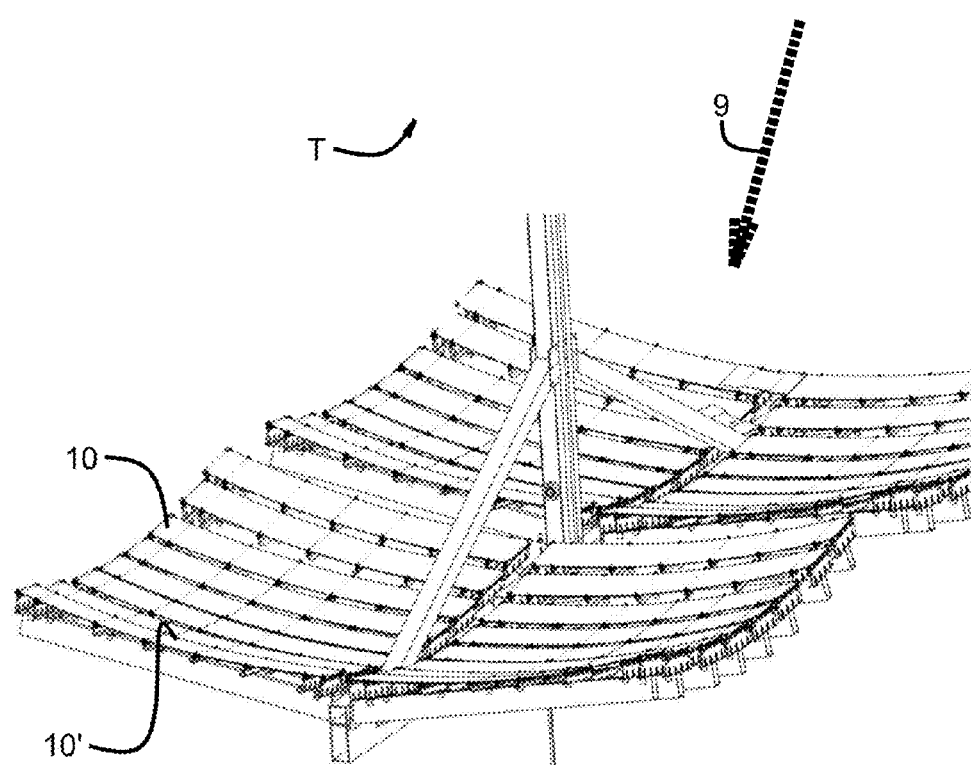
FIG. 26 shows an oblique wide-angle surface view of an alternate collector trough possessing multiple discrete and distinct collectors that can be used as taught by the instant invention.

Collector trough—can comprise any of any trough, mirrored surfaces, treated surfaces or array of optical components, passive or active, that create, by reflection, interference, refraction, or other optical phenomena a concentrated angular distribution of light for use by the instant teaching. A collector trough may be unitary in construction, or spread out among discrete or distinct components, such as mirror slats, prisms, light pipes, beads, or the like, such as shown in FIG. 26. The trough-like embodiments shown in this disclosure shall not be limiting and are shown for extreme clarity and illustrative purposes only.

Concentrated angular distribution of light—shall denote concentrated distribution of light formed as a result of incidence of solar energy upon a collector trough.

Delivery length—shall denote an applicable minimum length associated with the distance between a collector trough and a corresponding highly concentrated solar light in a concentrated angular distribution of light formed by that trough.

Field revenue—shall include any and all financial revenue, including credits or other instruments of value, or trades from other possible facilities for energy receipt including hot water or fluids, steam, electrical power or light.

Heat transfer fluid—can comprise any heat carrying medium.

Highly concentrated solar light—shall denote that portion of a concentrated angular distribution of light at or near a maximum available concentration.

Hybrid energy conversion system—shall, in the appended claims, refer to hybrid system that is able to produce thermal and photovoltaic power simultaneously and can supplement, if desired, the power provided to an electrical power grid.

Mirror—shall in this disclosure be a general term denoting any device capable of reflecting, directing, altering, or filtering electromagnetic waves in service of the instant invention, whether such reflecting, directing, alterating, or filtering is imaging, non-imaging; direct or diffuse; applicable to a broad range of light wavelengths, or targeted to a wavelength range, set of wavelength bands, or energy value; or whether it is of unitary construction or comprising multiple slats, parts, lenses, surfaces, or active regions. The term, mirror, herein can signify any of, or combination of any reflecting mirror; cold mirror, hot mirror, or dichroic filter; frequency-discriminating dichroic device; a concave or convex, or other lens of any geometric shape; or any other optical device that selectively reflects, directs, filters, or divides light, whether or not it discriminates according to frequency. Overall, such a mirror, lens, or other device can be flat, curved, concave, convex, or any combination thereof and can comprise fresnel or other lenses, such as those skilled in the art might select for forming a desired beam spot onto a solar energy conversion device according to the invention.

Multijunction Photovoltaic Cell—shall refer to any photovoltaic conversion device that comprises at least two pairs of p-n junctions, electrically interconnected (in series or in parallel), or employing any electrical or functional equivalent to p-n junctions. Traditionally p-n junctions have been constructed from semiconductor crystals with p-type or n-type doping as appropriate, but this shall not be limiting. Preferred embodiments of the instant invention are illustratively shown employing vertical multijunction (VMJ) photovoltaic receivers, but generally any photovoltaic device can be used.

Photovoltaic receiver—shall denote any conversion device using the Photovoltaic Effect, Photoelectric Effect, or other phenomena to convert incident light, such as solar light, to an electromotive force employed to drive electric charge carriers, negative and/or positive, and can in preferred embodiments, include vertical multijunction photovoltaic cells or heterostructures designed to produce high conversion efficiency.

Signal—shall include, throughout the specification and appended claims, any and all signals selected from interactive signals and transactive signals, including from any network or data web, from any of utility, information repository, distributed power generation, facility, sensor, transducer, cogeneration component, turbine, smart load, utility worker, system operator, or any associated system used to practice the instant invention.

Site controller—is any intelligent system that receives inputs and makes decisions that result in outputs, such as output signals, and can comprise a field controller or other substituent controllers, including any and all known logical components, such as microprocessors, hydraulic or pneumatic logic circuits, and can comprise a full time, part time, or occasional human site operator. This definition shall not be limited to discrete controllers on site, but can include components whose logic is effected using web-based transmission to an off-site server or controller.

Smart glass—shall comprises any material body or system, regardless of material composition, that allows for a change of state, or relative state, between transmission, and redirection or reflection of light or electromagnetic radiation. Smart glass shall include materials or systems employing liquid crystals, such as nematic systems; fluids containing filaments or orientable molecules; blind systems; shutters, and microblind systems which effect position changes in small structures.

Smart load—shall denote any electrical or other energy-consuming load, such as building heating, fitted with components so as to be capable of interactive communication, including transactive communication, to signal needed loading considerations for use by the instant invention.

Solar energy—shall denote any incoming radiation that is to be converted to thermal and/or electrical energy by the instant invention, and shall not be limited to natural solar light.

Thermal collector—such as a thermal receiver or tube shall denote any material body, regardless of shape, extent or overall size that performs substantial energy conversion from light via conversion of low frequency portions of the radiation spectrum or by largely thermal excitation. If taking the form of a heat collector element it can comprise any added future components able to perform energy conversion of light of a frequency, especially for which the photovoltaic receiver is not optimized. Using this definition, a strict thermal tube can be supplemented with other conversion devices, or may comprise prisms or lenses to off-load light to those other conversion devices. Finally, the thermal collector can comprise or be another photovoltaic receiver that is optimized for conversion of longer wavelength light components.

Transactive signal—shall denote any communication or information exchange by which a component, server, plant, or other system or device—including information repositories, weather monitoring systems, power generating plants, electric utilities, electrical loads, heating facilities, turbines, etc., act operatively as an information source useful in practicing the instant invention, and shall include any input, encoding, storage, transmission, retrieval or output from such system or device.

Turbine—shall refer to any component or system or machine that converts thermal energy to electrical energy or other desired energy, and can include engines that use pistons or other power-receiving structures.

Vertical Multijunction Photovoltaic Cell/Receiver—shall in this disclosure and in the appended claims denote any Multijunction Photovoltaic Cell or device so constructed, and formed, including material formulation, to comprise at least two substantially planar p-n junctions or interfaces and is further constructed, shaped and finished to allow disposition for light entry substantially parallel to, or at least an an acute angle with respect to at least one set of those planar junctions. This is in contrast to known single junctions photovoltaic cells or receivers.

DETAILED DESCRIPTION

Figure 1:
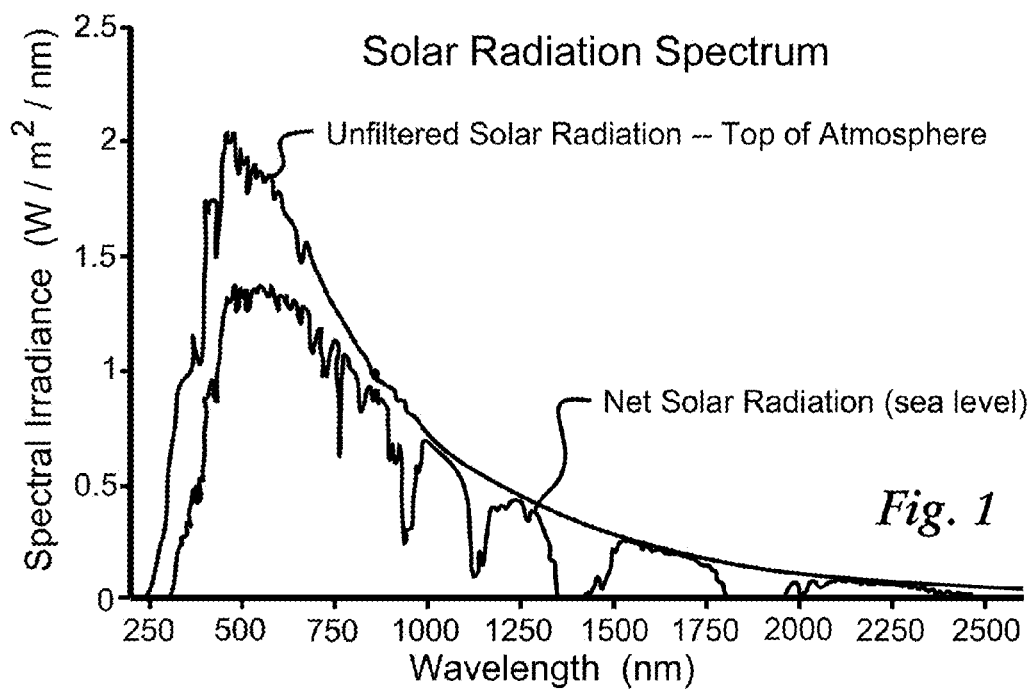
FIG. 1 shows a typical natural filtered and unfiltered solar radiation spectrum using a cartesian plot of spectral radiance versus wavelength.
Figure 2:
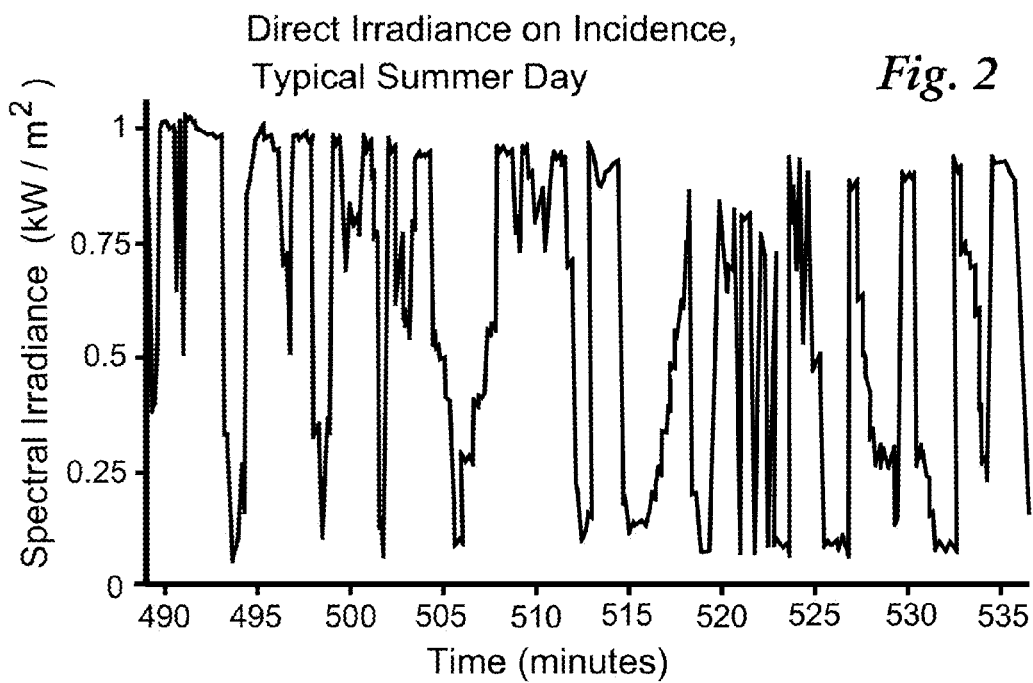
FIG. 2 shows spectral irradiance versus time for a typical sample summer day in a cartesian plot.
Figure 3:
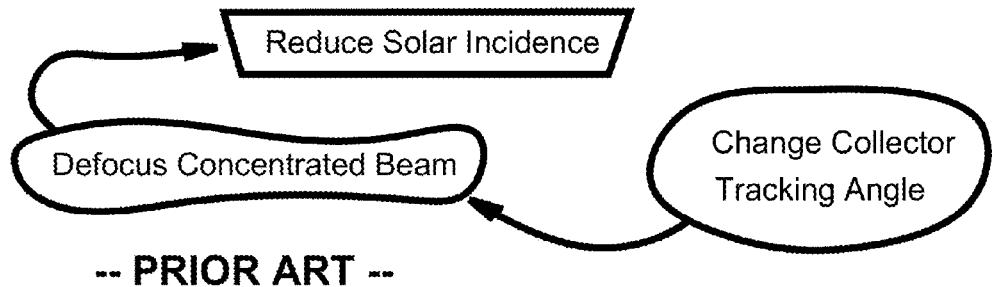
FIG. 3 shows a rough schematic representation of one prior art energy dump procedure for a hybrid photovoltaic/thermal distributed power generation plant.
Figure 4:
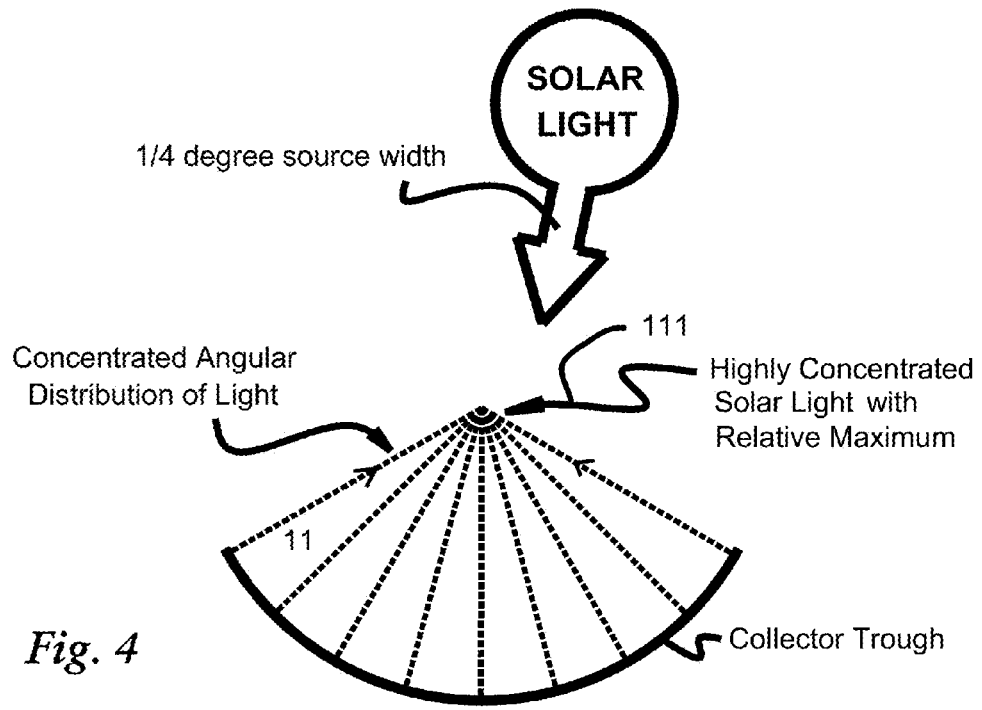
FIG. 4 shows a rough schematic of solar light being formed into a concentrated angular distribution of light by a collector trough, creating highly concentrated solar light.

In achieving the objectives of the instant invention, a concentrated angular distribution of light is established to provide radiation intensity and manipulational freedom as shown in FIG. 4, which gives a rough schematic for solar light (SOLAR LIGHT) of approximately ¼ degree width gathered by a Collector Trough which is designed according to parabolic curves or other designs known in art to form by reflection or other optical process a Concentrated Angular Distribution of Light (11) which comprises—and allows for—convergence to rays labeled as highly concentrated solar light 111 as shown. This highly concentrated solar light 111 has a Gaussian or other profile relative maximum intensity, shown diagrammatically at the apex indicated. Most concentrated photovoltaic systems rely on engineered predictable focused beams of highly concentrated light to function optimally.

Figure 5:
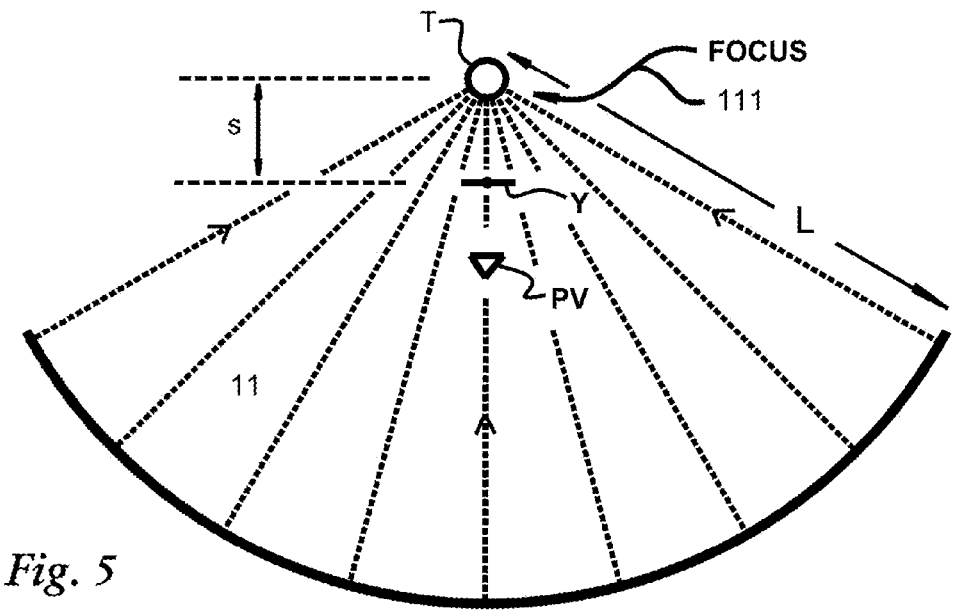
FIG. 5 shows the rough schematic of FIG. 4, in close-up view, and showing placement of a thermal collector, capture element, and a photovoltaic receiver according to one embodiment of the invention.

Now referring to FIG. 5, the rough schematic of FIG. 4 is shown in close-up view, and showing rough placement of a thermal collector, capture element, and a photovoltaic receiver according to one embodiment of the invention. As contemplated by the instant invention, a thermal collector T whose fabrication and construction is known to those skilled in the art, is placed in a known manner using known structures at or near a focus or relative maximum of the highly concentrated solar light 111. The collector trough can take various forms not shown here, as stated in the Definitions section of this disclosure and the fabrication and construction of thermal collectors and receivers is known to those skilled in the art and is discussed below. The collector trough is so formed to provide what is shown illustratively here as a FOCUS at a distance Las shown from a surface of the trough. In a preferred embodiment, situated at short path length s from that focus is a capture element Y. As taught by the teachings of the instant invention, capture element Y can change state on demand, and can act as an apportionment device or valve which regulates how much energy is removed from concentrated angular distribution of light 11 for conversion by photovoltaic receiver PV as shown. The highly concentrated solar light 111 can be tens or hundreds or thousands of suns intensity AM1.5. Further details will be given in the discussion below. If desired, capture element Y can be used to capture the concentrated angular distribution of light sufficiently to cause substantially all solar light incident upon it to be deflected to another solar energy conversion device, shown illustratively as photovoltaic receiver PV. Capture element Y can be so operatively positioned so as to deliver upon the illustrative photovoltaic receiver PV deflected highly concentrated solar light (111).

Figure 6:
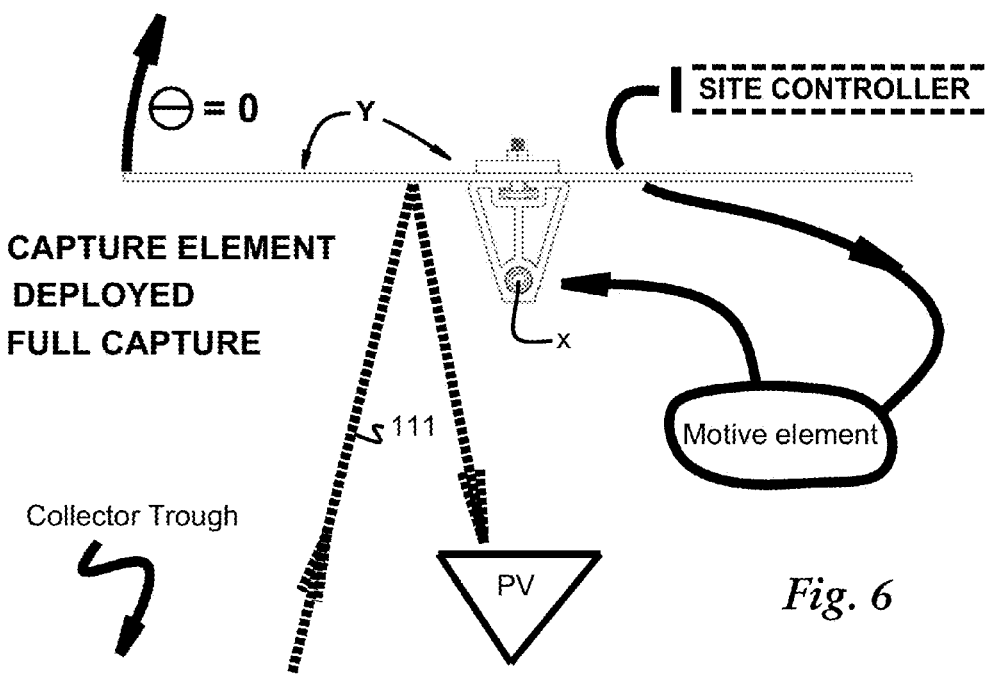
FIG. 6 shows a close-up side cross-sectional view of a capture element according to the invention, under the control of a site controller.

Now referring to FIG. 6, a close-up side cross-sectional view of a capture element Y according to the invention is shown under the control of a site controller. Shown here as a dichroic or standard mirror, the capture element Y can be or comprise a flat pane of glass or optically reflective, refractive, sensitive, or modulatable material, as given in the definitions section. In this embodiment as shown, highly concentrated solar light 111 from a collector trough (not shown) impinges upon a bottom surface of capture element Y in its present state and is reflected, possibly fully, for impingement upon photovoltaic receiver PV as indicated. capture element Y can be secured using known gaskets, grommets, isolators, mounts or bracketing to an assembly as shown that possesses a rotation axis x, and a Motive Element, not explicitly shown, can urge capture element Y into differing physical orientations in a manner and to a degree, and according to timing set by, a SITE CONTROLLER as shown and discussed below. As shown, an appropriate angular variable theta is shown at zero degrees.

In an alternate embodiment, capture element Y can itself be or comprise a photovoltaic receiver PV. Now referring to FIG. 7, the rough schematic of FIG. 5 is shown, but now showing this alternate embodiment with a capture element Y that comprises a photovoltaic receiver, placed for illustrative purposes at a short path length s from the FOCUS or relative maximum as shown. In this embodiment, capture element Y can still be rotated, and the effect is the same, as the light allowed to impinge upon the photovoltaic receiver PV can be modulated under the control of a site controller.

In some preferred embodiments of the invention, capture element Y can be rotated, or even moved or translated to allow for various states. Now referring to FIG. 8, a rough schematic representation of possible effects of change of a capture element position variable according to the invention is shown. Depending on geometric layout and mechanical design by those skilled in the art, a change of a position variable such as an angular variable theta (or a translation variable as shown below) to an indexed or determinative value shown as y can result in actions to Block the photovoltaic receiver PV; Stow the photovoltaic receiver PV to prevent incidence of light and possibly prevent concentrated angular distribution of light 11 or highly concentrated solar light 111 from being blocked; allow for a Partial subtend of the photovoltaic receiver PV in concentrated angular distribution of light 11 or highly concentrated solar light 111; or allow for Full incidence of such light upon photovoltaic receiver PV. If those skilled in the mechanical arts design for partial subtends in the manipulation of capture element Y, a graded or even a continuous variation in Incidence upon photovoltaic receiver PV can occur, as shown in FIG. 9, as an illustrative angular position variable y varies from zero to y max. This is merely an example, and any type of functional relationship can exist between a change in a capture element position variable and the resultant relative incidence obtained, including sudden jumps in incidence that might be needed to accelerate overall system response.

Figure 10:
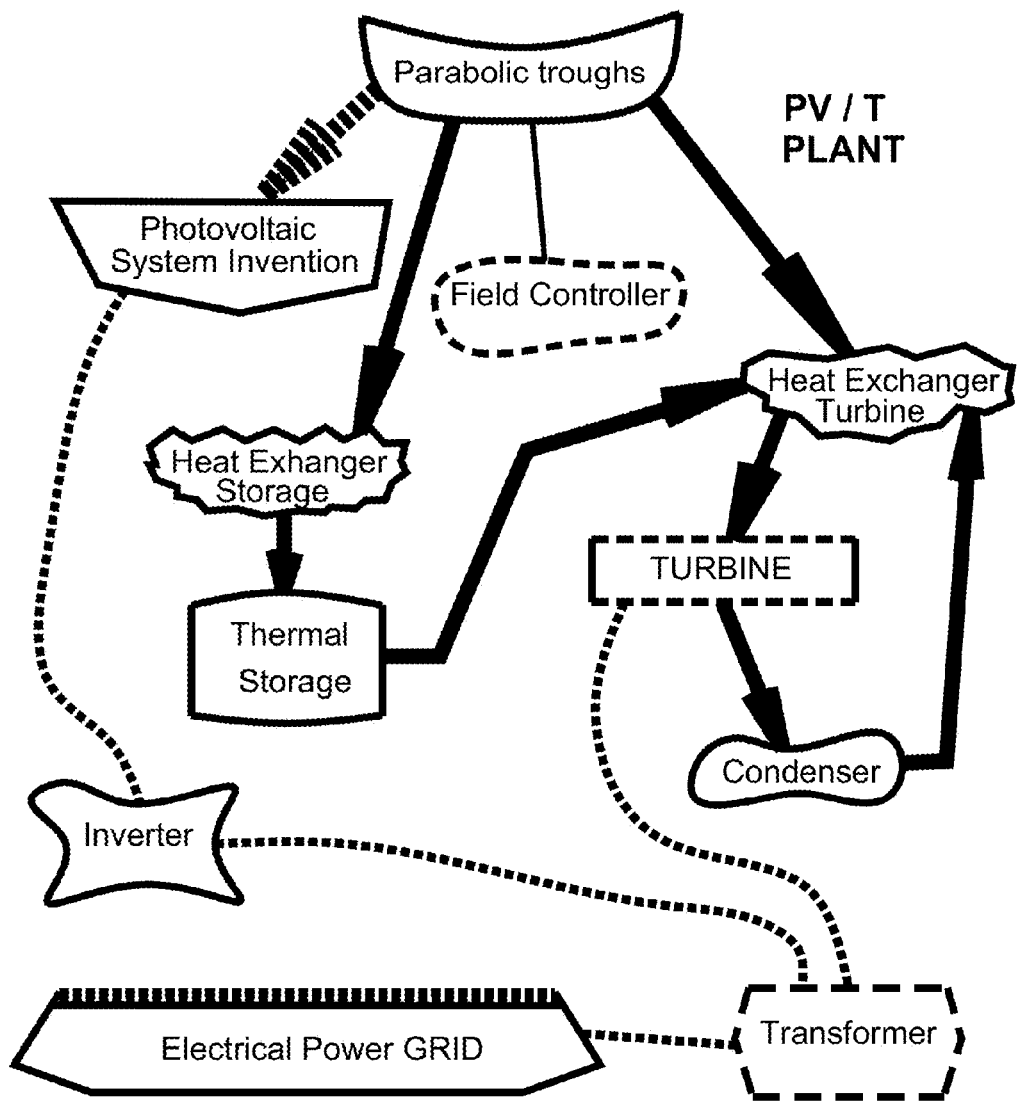
FIG. 10 shows a schematic representation of some elements in a possible distributed hybrid photovoltaic/thermal power generation plant using the instant invention.

Now referring to FIG. 10, a schematic representation of some elements in a possible distributed hybrid photovoltaic/thermal power generation plant (PV/T PLANT) using the instant invention are shown. Diagrammatic Thermal Flow, Electricity, Data & Control, and Light are shown using line styles indicated in the legend at the bottom of the figure. The collector troughs as mentioned are shown as Parabolic troughs, which comprise thermal collectors (not shown) and are designed for dual energy flows of high temperature heat transfer fluid (not shown). This thermal energy originates from the Parabolic troughs and flows to both Heat Exchanger Storage and a Heat Exchanger Turbine as shown. The Heat Exchanger Storage can allow thermal flow to Thermal Storage, which can comprise known heat storage media such as rocks, water, ethylene glycol or similar fluids, or molten salts that are housed and managed in a manner known to those skilled in the art. Upon selective demand, and preferably under the control of a site controller, this heat can be sent to the Heat Exchanger Turbine and be combined with thermal flow coming directly from the Parabolic trough as shown, The Heat Exchanger Turbine can comprise substituent systems like natural gas burners to augment, also preferably under the control of a site controller, the heat delivered to a TURBINE as shown. It is here that the thermal contribution in PV/T is converted to good use, either to drive a mechanical load such as a water or hydroelectric pumping station, or to drive directly a generator set (not shown) for production of electrical power. The heat transfer medium can condense, if necessary, at the Condenser, as shown, prior to return to the TURBINE.

To achieve many of the objectives of the invention, the instant invention as shown is embodied in the construction and operation of the Photovoltaic System Invention as shown, where light is delivered in a mutable way to photovoltaic receiver PV (not shown). This light is converted by a multijunction photovoltaic receiver, a vertical multijunction photovoltaic receiver or other photovoltaic receiver and after power processing and other functions provided by an Inverter, the electrical power is transferred, along with power from the TURBINES, to a Transformer as shown. The Transformer can comprise ancillary equipment such as power reactors, power capacitors and the like and the resultant electrical energy is backfed as shown to the Electrical Power GRID.

Figure 11:
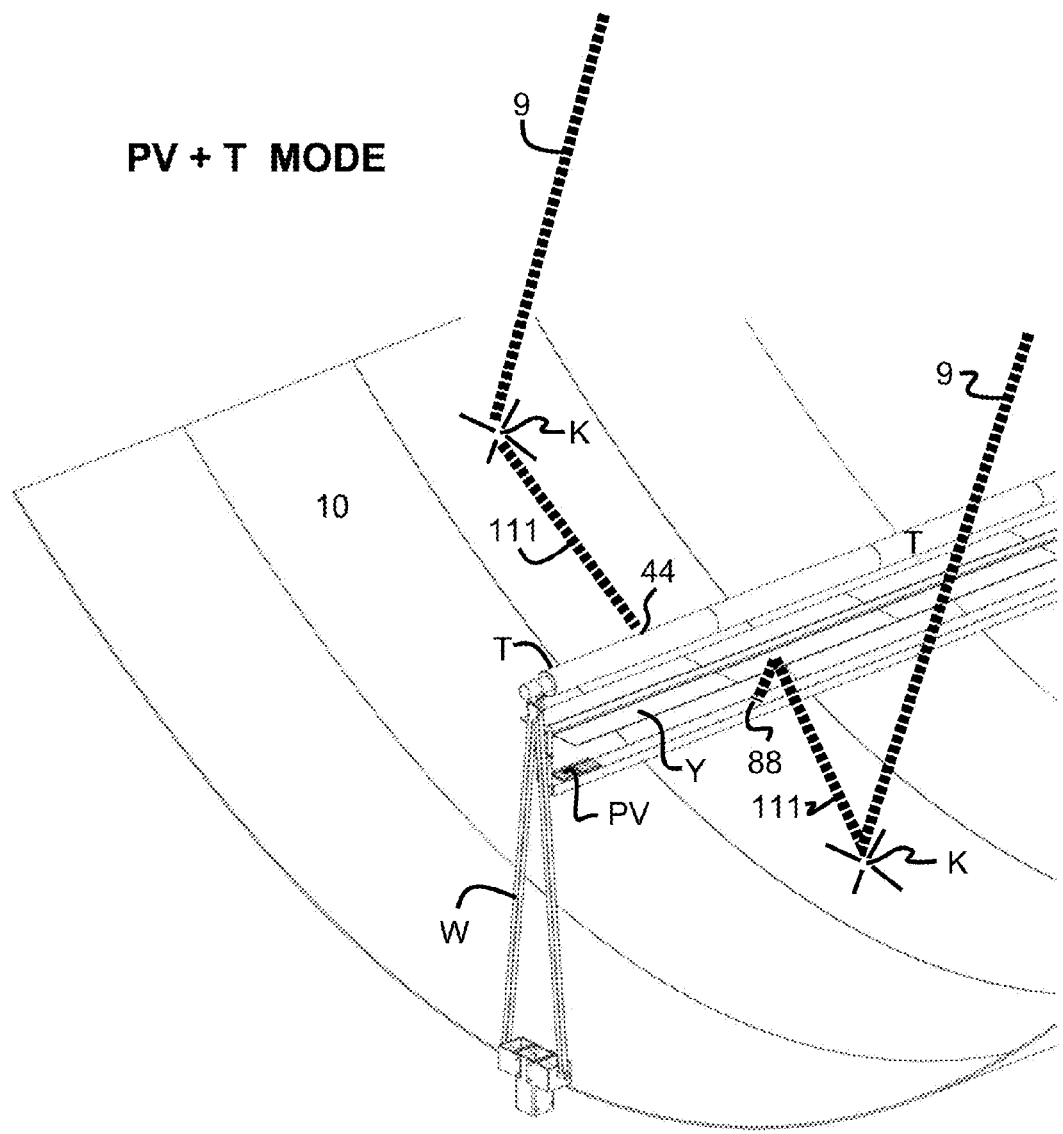
FIG. 11 shows a partial oblique view of a conversion apparatus suggested by the instant invention, showing a collector trough, thermal collector, capture element and a photovoltaic receiver.

Now referring to FIG. 11, a partial oblique view of a conversion apparatus suggested by the instant invention is shown, showing a collector trough, thermal collector, capture element and a photovoltaic receiver in a surface view. A mirrored parabolic collector trough (10) is now shown in a partial surface view, with two illustrative light beams, shown as sunlight 9 inpinging upon the trough as shown. The upper light beam sunlight 9 is shown impinging upon a mirrored surface of collector trough 10 and undergoing reflection K and for most embodiments continuing to converge as highly concentrated solar light 111 with impingement 44 by design onto thermal collector T as shown. Collector trough 10 can be angled or moved to track the sun's progress, as is well known in the art of heliostats and solar arrays. Thermal collector T is mounted on known frame or support W and is so sized, positioned, oriented and shaped to create the concentrated angular distribution of light as mentioned above, with a characteristic focal length or delivery length, as measured from a surface of said collector trough to a relative maximum of highly concentrated solar light formed. This highly concentrated solar light 111 continues to converge and focus until it is at or near a relative maximum at inpingement 44. The light concentration can be tens or hundreds or thousands of suns AM1.5. This high intensity light can be modulated by any number of assemblies as shown, such as by action of capture element Y, which is shown as a slat of mirrored glass or metal, rotatably affixed also in support W along with photovoltaic receiver PV as shown, a further distance toward collector trough 10 as discussed above. As can be seen, the lower beam, sunlight 9, impinges also upon collector trough 10 and undergoes reflection K and allows that highly concentrated solar light 111 makes a similar reflection at capture element Y (not explicitly labeled and shown for clarity) and continues toward photovoltaic receiver PV for impingement upon it at impingement 88 as shown. Generally, as will be seen in the figures discussed below, capture element Y is selectively deployable and is formed, sized, shaped, positioned and oriented to capture selectively on demand at least some of said concentrated angular distribution of light for any of reflection to, partial reflection to, direction to, or conversion by, a second solar energy conversion device, which in the numerous illustrative examples shown in this disclosure, is shown as a photovoltaic array. However, the roles of thermal collector T and photovoltaic receiver PV can be switched. This general case is reflected in the appended claims.

Figure 12:
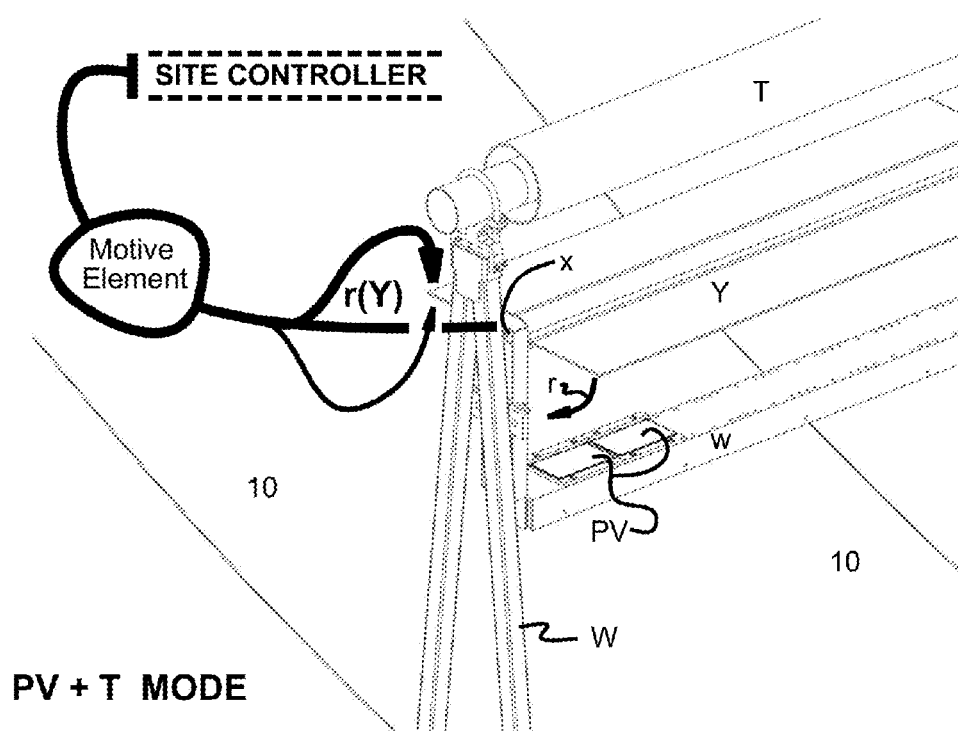
FIG. 12 shows a close-up oblique view of the conversion apparatus of FIG. 11, showing schematically a capture element under rotational control by a motive element signaled by a site controller.

The photovoltaic and thermal dual modes of conversion made possible by the apparatus shown in FIG. 11 can be modulated according to the teachings of the instant invention, as shown in FIG. 12, which shows a close-up oblique view of the conversion apparatus of FIG. 11, showing schematically a capture element under rotational control by a motive element signaled by a site controller. A SITE CONTROLLER, labeled, but not explicitly shown, uses known engineering to signal, engage with, or actuate a Motive Element, also labeled, but not explicitly shown, to turn capture element Y on intelligent demand as conditions warrant. The motive element can be a solenoid, lever, hydraulic or pneumatic piston, or any other electromechanical device that can impart to capture element Y a rotation about rotation axis x as shown, providing a functional and operative variable r(Y) as shown to which the capture element Y synchronizes or nearly synchronizes. As capture element Y is rotated or turned clockwise using a rotation r as shown, less and less will impinge at 88 as shown in the previous figure, allowing for dynamic control of the apportionment of energy between thermal collector T and photovoltaic receiver PV. This moveable capture element Y allows for extremely fast response, including on the scale of cloud cover variations, when necessary, as controlled by the site controller, which, as discussed below can include a human operator, such as a site operator or a utility line worker.

Figure 13:
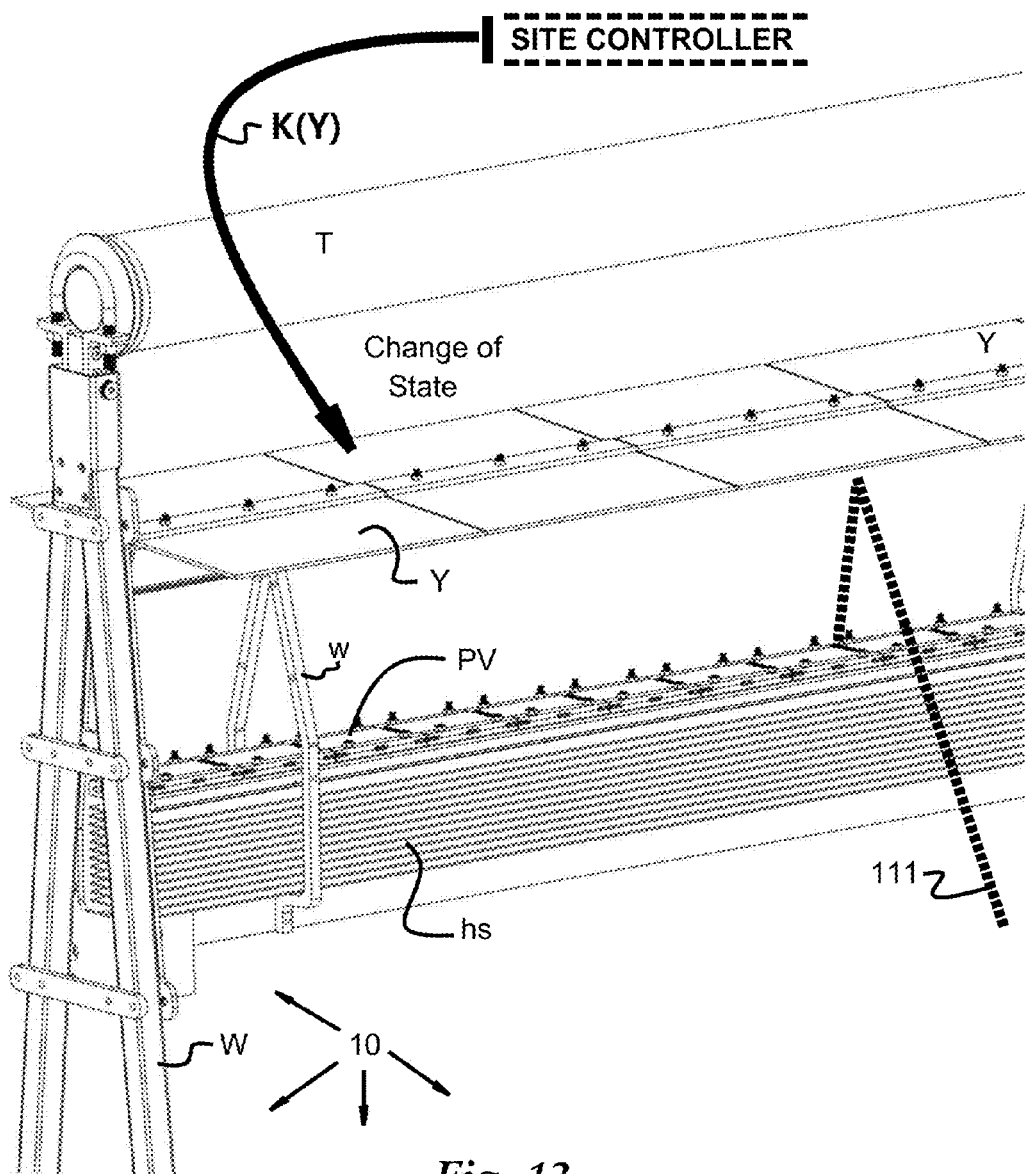
FIG. 13 shows one preferred embodiment of the invention in close-up, oblique view, with a thermal collector, capture element and photovoltaic receiver in power producing mode with incidence from a concentrated angular distribution of light.

Now referring to FIG. 13, one preferred embodiment of the invention is shown in a close-up, oblique view, with the collector trough 10 not explicitly shown for clarity. Thermal collector T can be seen bolted using a pipe or U-clamp to a part of support W. The location of thermal collector T is preferably at or near the focus of the concentrated angular distribution of light 11, while at a short path length distance away, capture element Y is shown and rotatably affixed also to support W as previously shown. Positioned under capture element Y on the figure is photovoltaic receiver PV, which can comprise an array of multijunction photovoltaic receivers, or vertical multijunction photovoltaic receivers. Mounted under photovoltaic in the figure is a heat sink hs as shown, which is in turn supported by heat sink supports w that are ultimately affixed to support W at a point not explicitly shown.

Figures 32, 33:
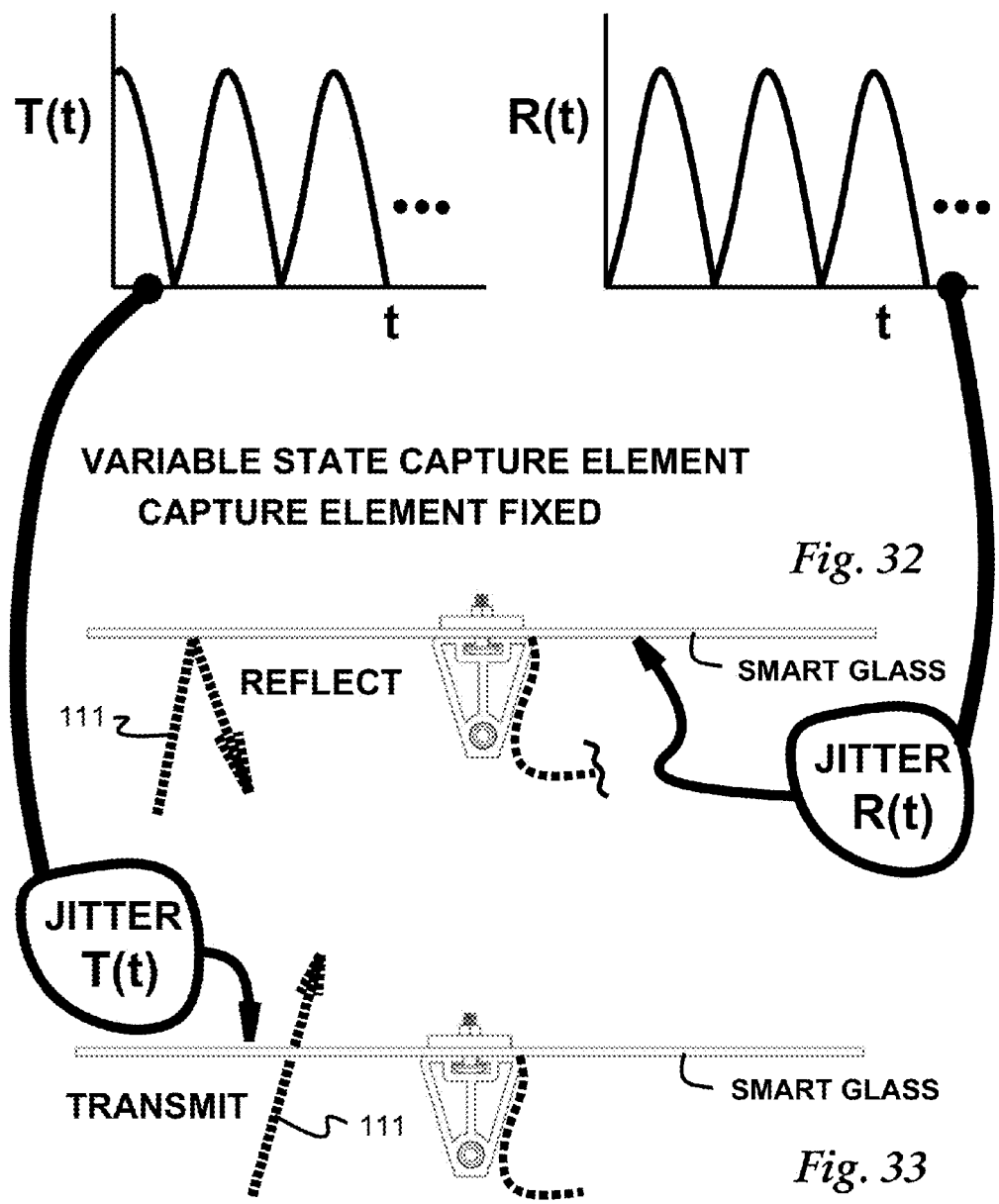
FIGS. 32 and 33 show close-up side cross-sectional views of a capture element according to the invention similar to that shown in FIGS. 30 and 32, with variable state smart glass exhibiting reflective and transmissive behaviors, respectively, by imposition of a jitter signal form that achieves various objectives taught by an alternative preferred embodiment of the instant invention.

In this particular preferred embodiment, capture element Y comprises two-state or multiple-state glass, as discussed further in the description for FIGS. 31 and 32. This glass (or any other suitable material having the same operational characteristics) will allow a signal or electrical or other input arriving from the site controller to determine the reflectivity of the glass, shown as reflectivity K(Y) which can induce a change of state, such as from being reflective to allowing transmission of light. This can allow for extremely fast response times without necessity for physical turning of the mirror or capture element Y. In the mode operation shown, highly concentrated solar light 111 is more or less fully reflected by capture element Y and the light within a certain capture element angular range (discussed below) is redirected toward vertical multijunction photovoltaic receiver PV as shown.

The capture element Y can embody both change-of-state characteristics, and rotational capability, such as when it is desired to stow or render inactive the photovoltaic receiver PV array or any portion thereof.

Figure 14:
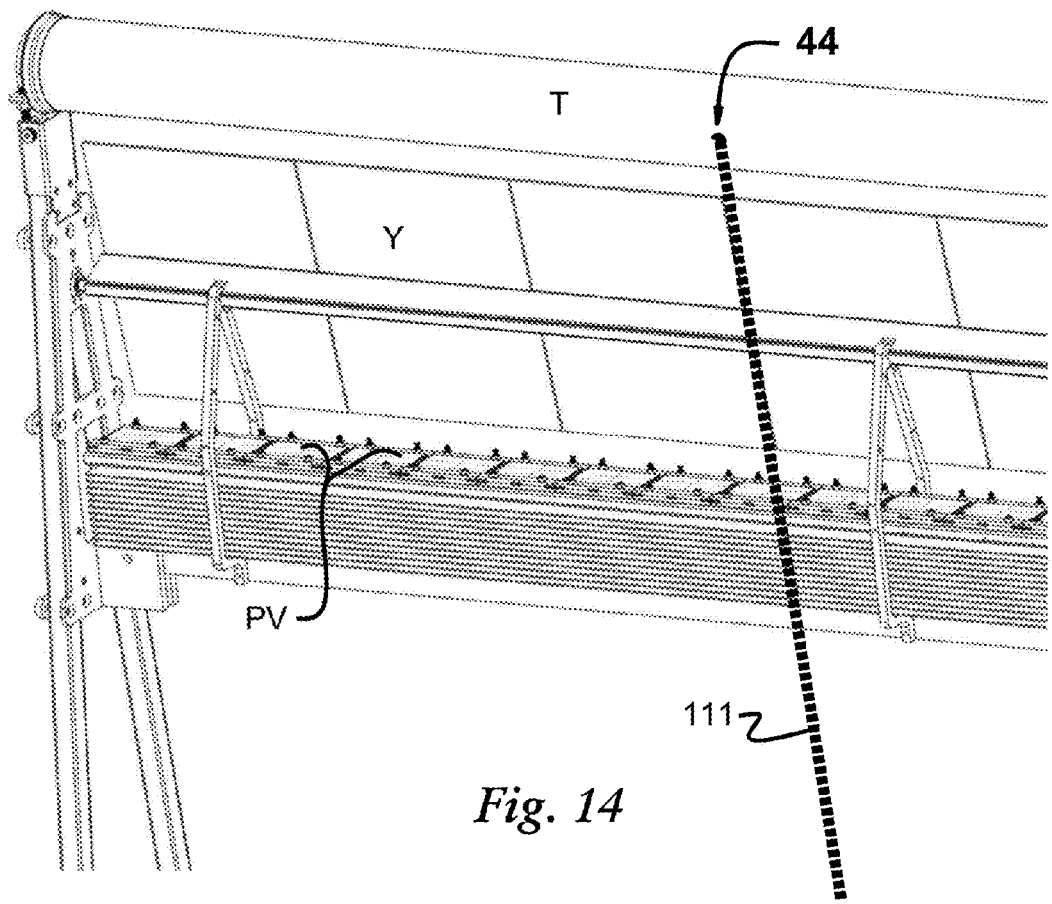
FIG. 14 shows a close-up oblique view similar to that of FIG. 13, with the capture element shown fixed in a position to allow a thermal conversion only mode.

Now referring to FIGS. 14 and 16, a close-up oblique view similar to that of FIG. 13 is shown, with the capture element Y shown fixed in a position to allow a thermal conversion only mode. As can be seen, a capture angular variable such at theta in the previous figures can be or approach 90 degrees, allowing that the capture element Y is folded or stowed away from acting upon the highly concentrated solar light 111, which is shown in the figure as emerging from collector trough 10 and impinging directly upon thermal collector T at impingement point 44. FIG. 16 shows a close-up oblique view similar to that of FIG. 14, showing the bottom active face of the capture element. The central attachment support shown running across the capture element Y can comprise mountings or grommets or high molecular weight polymer shapes to hold reliably the active glass or metal used in the capture element, and such an attachment support can also be mirrored to reduce energy losses and keep heat from absorbed light to a minimum. Alternatively, the capture element Y can be held in a perimeter frame, particularly one that will accommodate any thermal expansion from energy loss absorption in the capture element, as those skilled in the mechanical arts can appreciate.

If desired, apportionment of highly concentrated solar light 111 between thermal collector T and capture element Y can be partial, either by virtue of selection of a positional variable by a site controller, or by using two-state or multiple-state glass.

Figure 15:
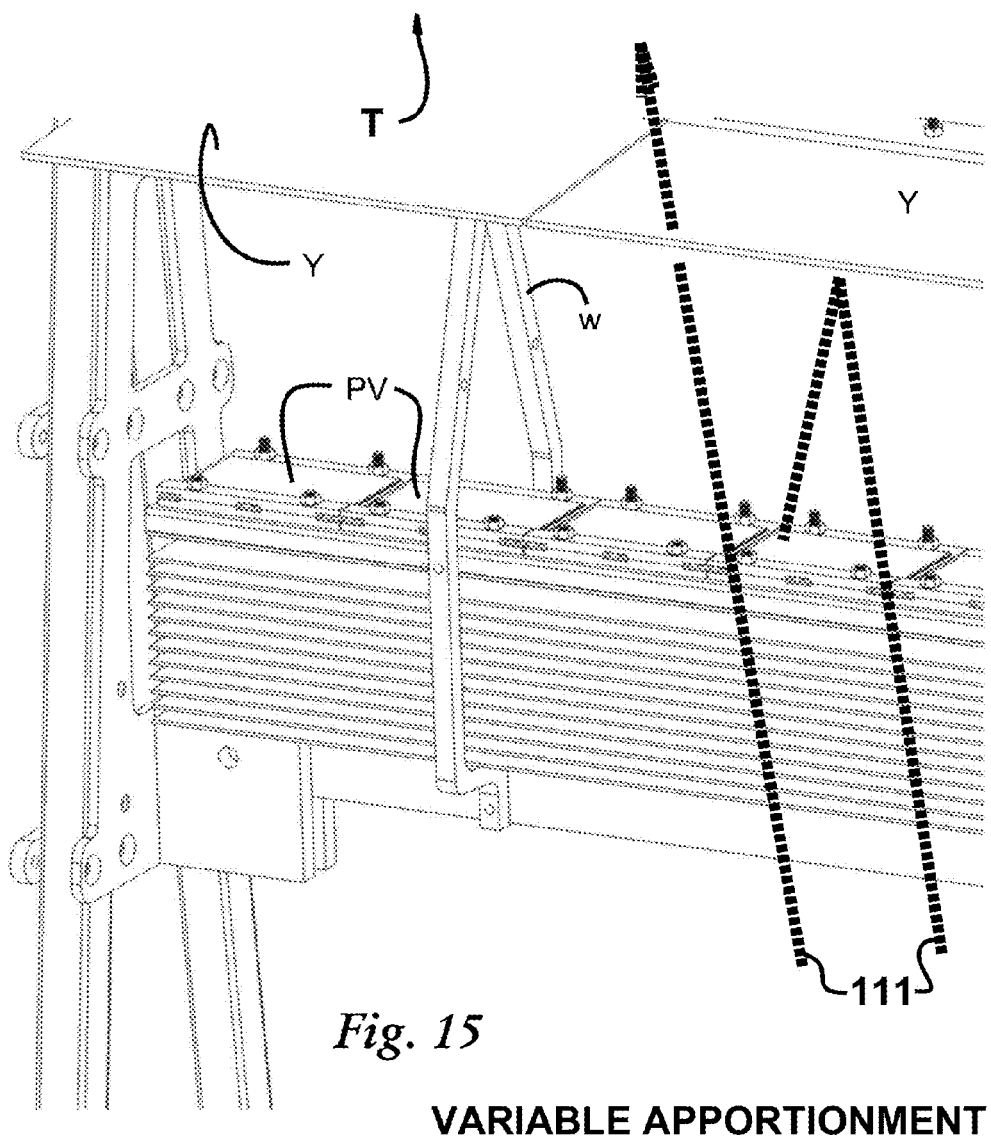
FIG. 15 shows an extreme close-up oblique view similar to that shown in FIG. 13, depicting an alternate embodiment of the invention, where the capture element allows a variable apportionment between thermal and photovoltaic energy conversion.

Now referring to FIG. 15, an extreme close-up oblique view similar to that shown in FIG. 13 is shown, depicting an alternate embodiment of the invention, where the capture element allows a variable apportionment between thermal and photovoltaic energy conversion. If capture element Y comprises a known cold mirror in a preferred embodiment, both transmission of thermal radiation to the thermal collector T can occur, and reflection of shorter wavelength infrared and visible light can be reflected for use by the photovoltaic receiver PV.

Alternatively, capture element Y can be positioned or its state can be specified (including portions of capture element Y locally) to allow for apportionment of the concentrated angular distribution of light 11 that becomes highly concentrated solar light 111 between both the thermal collector T (off the page and not shown) and the photovoltaic receiver PV. In the figure, the left beam, highly concentrated solar light 111 passes through capture element Y to continue onto impingement at thermal collector T, while the right beam highly concentrated solar light 111 is reflected downward to photovoltaic receiver PV.

Figures 17, 18:
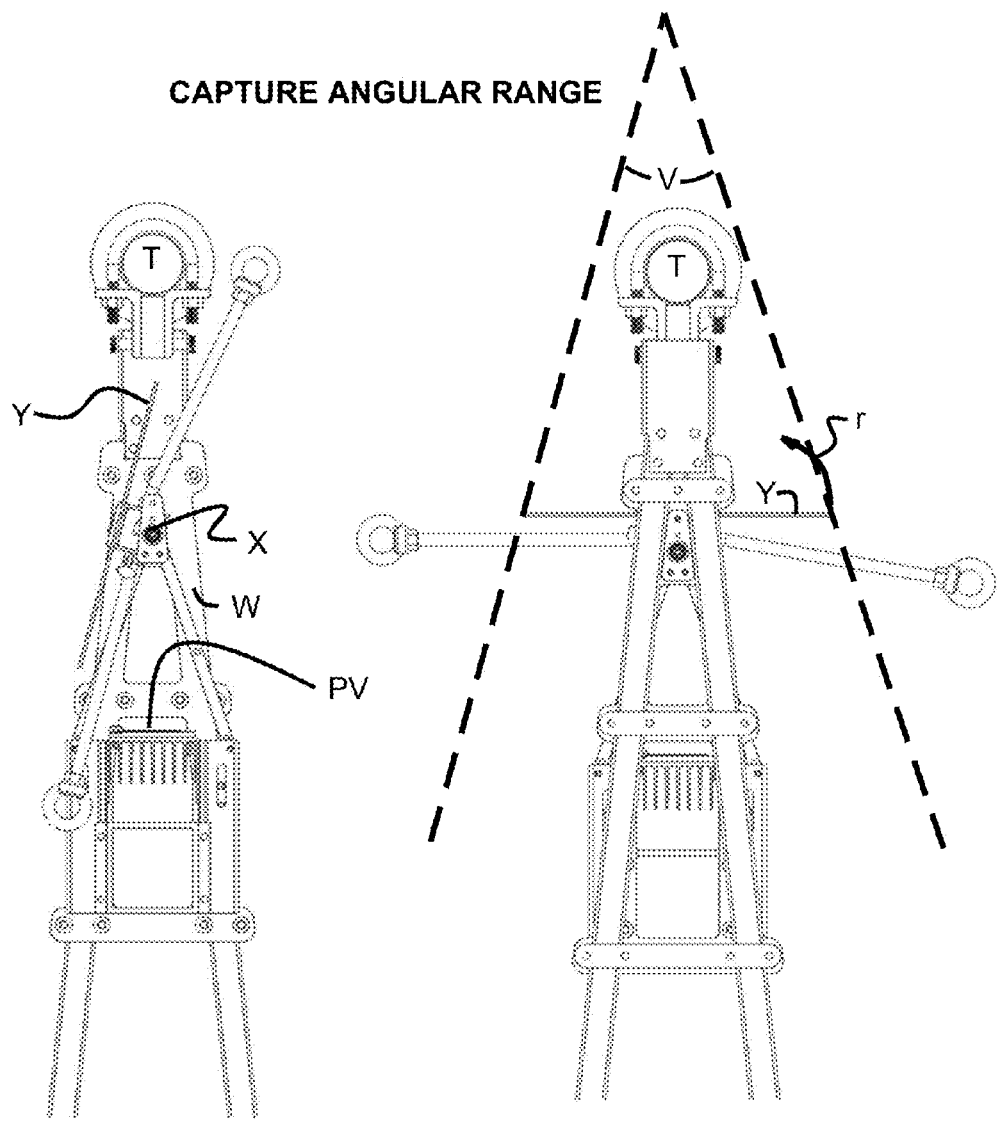
FIGS. 17 and 18 show close-up side surface views of one embodiment according to the invention, with the capture element in two differing deployed positions, and showing diagrammatically a capture angular range variable.

Now referring to FIGS. 17 and 18, close-up end or side surface views of one embodiment according to the invention are shown, with the capture element in two differing deployed positions, and showing diagrammatically a capture angular range variable that is ultimately controllable by a site controller. End-on views are now shown, with rotation axis x shown entering the page, and capture element Y shown at left at a nearly 90 degree angle relative to the same apparatus on the right, which shows the capture element Y at about zero degrees. To reduce energy losses, the bottoms of photovoltaic receivers PV as shown can be mirrored, so that light that would otherwise impinge wastefully upon the bottoms can be at least partially redirected back to the collector trough 10 (not shown). The possible capture angular range to capture highly concentrated solar light 111 is shown on the right (V). If desired, multiple capture element Y can be arrayed inside collector trough 10 to make more of the highly concentrated solar light 111 capable of capture for redirection to photovoltaic receiver PV, or as discussed below for direct absorption by same.

Now referring to FIG. 19 an array of vertical multijunction photovoltaic cells thermally coupled to a heat sink is shown that can be used to practice the instant invention. FIG. 20 shows an oblique surface view of a sub-array of the vertical multijunction photovoltaic cells of FIG. 19. vertical multijunction photovoltaic receiver PV is preferably thermally bonded using known techniques and materials to a heat sink hs as shown. Cell receiver modules can contain six individual cells as shown, of a size manageable for semiconductor production lines, such as 2.1 cm×5.5 cm, allowing for a array module of 120 mm×95 mm. In FIG. 19, four such modules are shown. Two series connected groups of three vertical multijunction cells connected in parallel can generate several hundred volts, such as 300 volts, with light intensity inpinging upon the vertical multijunction array of only 30-40 suns. The arrays shown can comprise known materials such as cover glass and glass transparent bonding, thermal interface material or paste; wire covers and waveguides, and a circuit board (not shown).

Generally, the capture element Y is so articulatably formed as to be selectively deployable for light capture by either [1] transitioning at least one optical property selected from reflectivity and transmissivity; and [2] gross movement/modulation across a spatial variable such as a capture angular range as labeled in FIG. 18, or a capture translational range. Also, the capture element Y does not have to redirect light to photovoltaic receiver PV. Rather, it can itself comprise a photovoltaic receiver PV.

Figure 21:
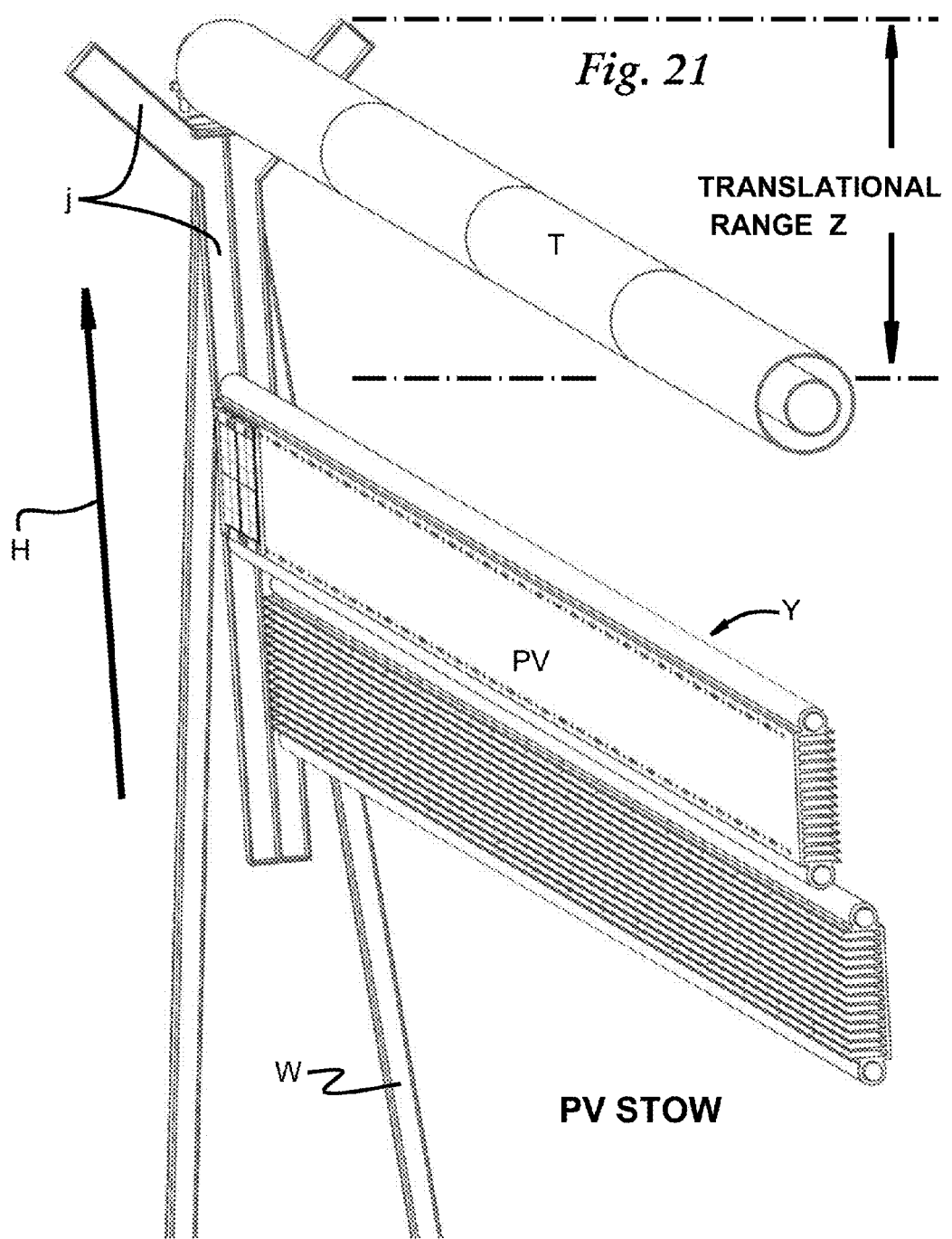
FIG. 21 shows an oblique surface view of an alternate preferred embodiment of the invention, with two capture elements deployable using change of a translational positioning variable, and themselves comprising photovoltaic receivers.

Now referring to FIG. 21, an oblique surface view of an alternate preferred embodiment of the invention, with two capture elements deployable using change of a translational positioning variable, and themselves comprising photovoltaic receivers. As can be seen, thermal collector T is still affixed to support W, but capture element Y comprises two oppositely oriented subassemblies which themselves comprise a photovoltaic receiver PV with associated heat sinks. Both halves of the capture element Y are shown in a stowed position so as to not be exposed to much highly concentrated solar light. But if desired, a site controller (not shown) can direct capture element Y to move upward in the figure in the general translational direction H along guide channels j as shown. The allowable movement of translation is shown as Translational Range Z and the extent of this range is shown by the arrow on the right. The translational variable in general can be literal, as in a certain length along an axis, or parametrized, such as the length moved along guide channel j as shown.

Figure 22:
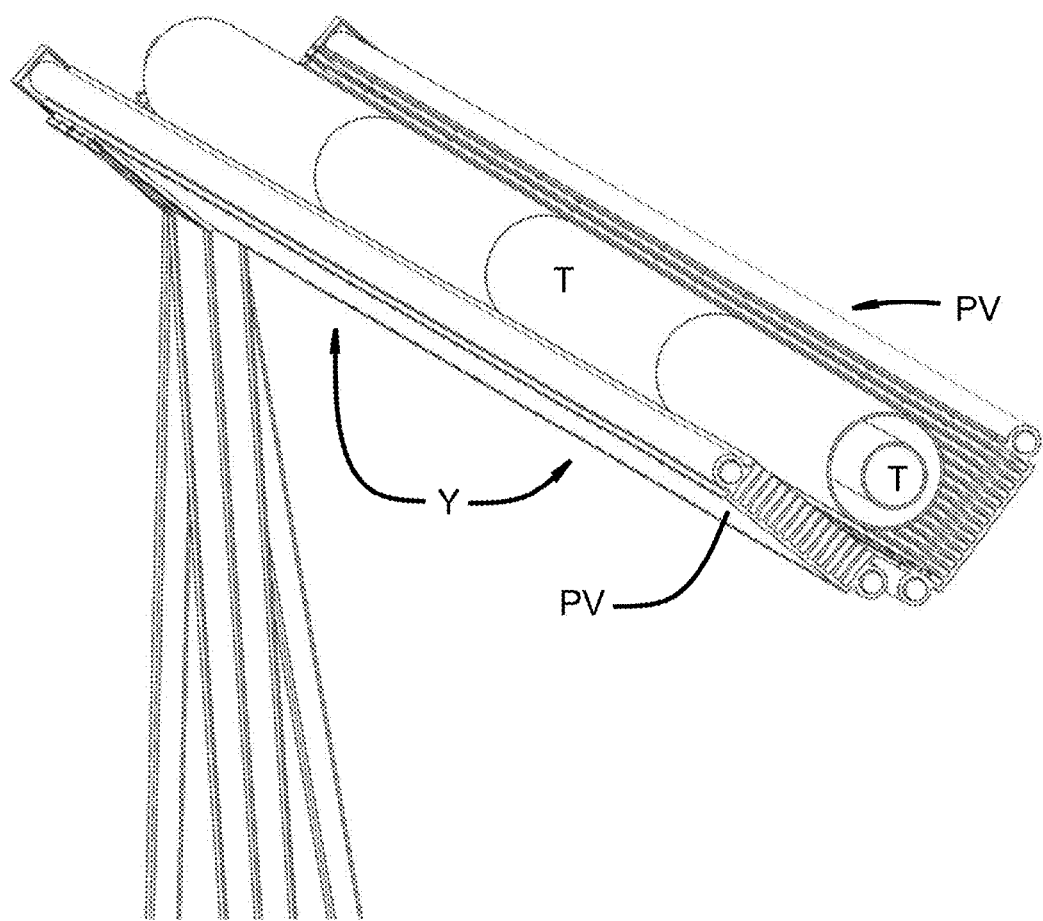
FIG. 22 shows a close-up of the view of FIG. 21, with the capture elements deployed and fully translated, enabling a block of the thermal collector and a Full PV Mode.
Figure 23:
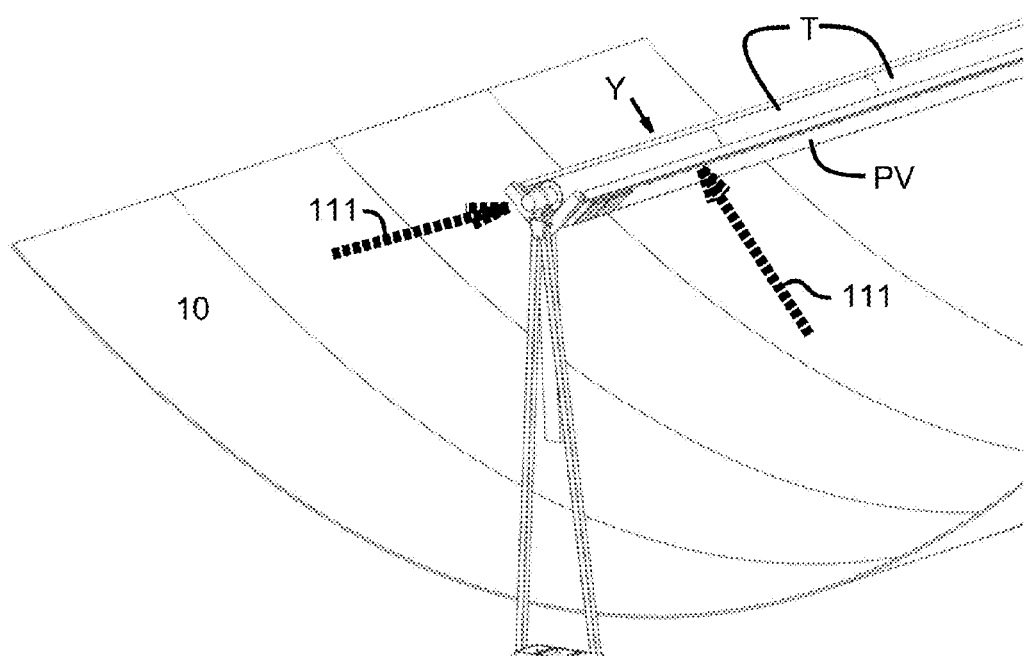
FIG. 23 shows a wide-angle view of the hybrid photovoltaic/thermal system of FIG. 22, revealing the collector trough and concentrated angular distribution of light.

This embodiment will allow, if desired, very fast transition to a FULL PV mode and this is shown in FIG. 22, which shows a close-up of the view of FIG. 21, with the capture elements deployed and fully translated, enabling a block of the thermal collector and a Full PV Mode. In this mode all or virtually all concentrated angular distribution of light 11 and highly concentrated solar light 111 (not shown or labeled in the figure) can be kept from impinging thermal collector T and will allow a fast conversion of an entire hybrid distributed solar energy conversion plant to shut down thermal production in as little as ½ second. This is shown explicitly in FIG. 23, which shows a wide-angle view of the hybrid photovoltaic/thermal system of FIG. 22, revealing the collector trough and the impingement of concentrated angular distribution of light 11 only upon capture element Y comprising photovoltaic receivers PV.

Figure 24:
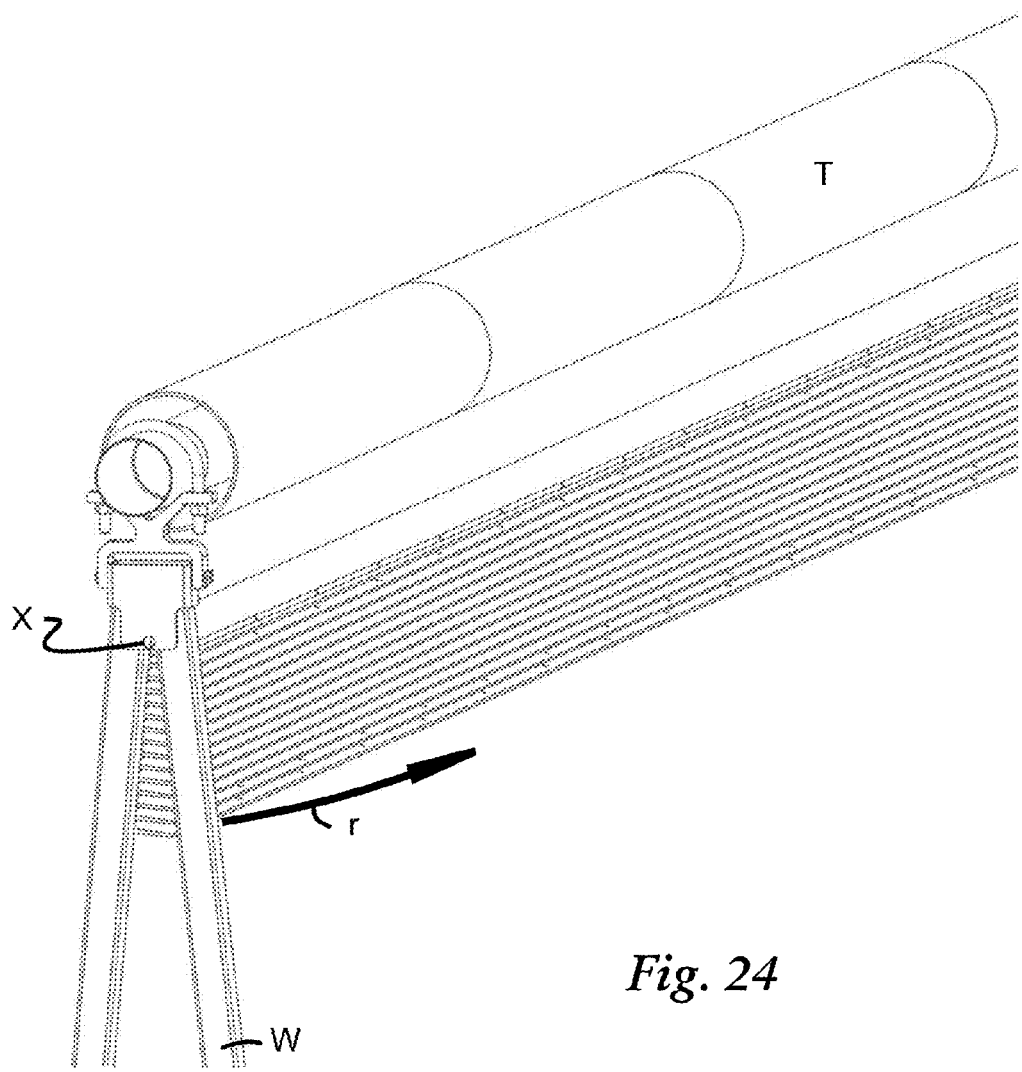
FIGS. 24 and 25 show close-up oblique angle surface views of another alternate embodiment of the invention, depicting a capture element that is sized, positioned and formed to alow a door-like rotary motion to allow for angular deployment.
Figure 25:
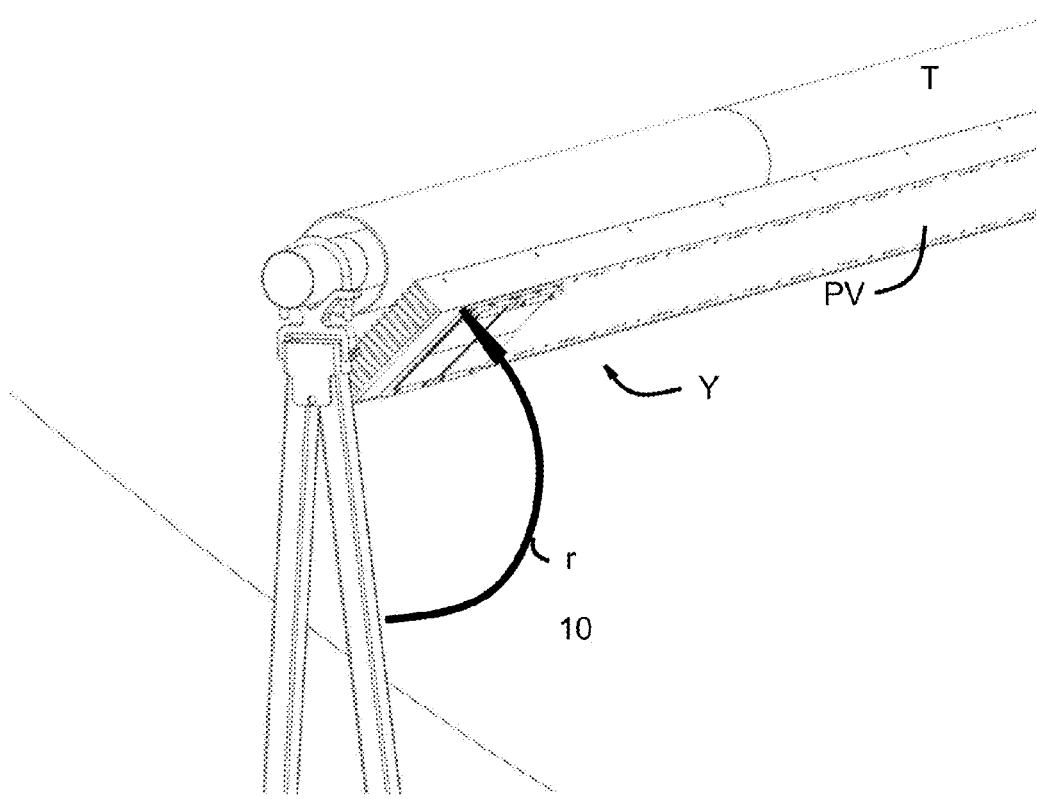

Now referring to FIGS. 24 and 25, close-up oblique angle surface views of another alternate embodiment of the invention are shown. In this embodiment, capture element Y is sized, positioned and formed to alow a door-like rotary motion r to allow for angular deployment about rotation axis x as shown. Deployment is shown in FIG. 25, which shows the capture element Y swung into position allowing for a PARTIAL THERMAL BLOCK as shown. This can be accomplished in as little as ¼ second if desired, upon movement of a motive element commanded by the site controller.

FIG. 26 shows an oblique wide-angle surface view of an alternate collector trough possessing multiple discrete and distinct collectors that can be used as taught by the instant invention. As shown, collector trough 10 can comprise individual slats or subassemblies 10' that can function in a manner similar to the others illustratively shown. Those skilled in the art can use the instant teachings and apply them to geometric variants to suit local demand and engineering requirements. As those skilled in the art, the instant teachings can be used to practice the invention on a scale smaller than illustratively presented, including use of miniature troughs and capture element systems, etc.

Thermal tubes that can be used as thermal collectors in the instant invention include tubular receivers made by Schott (Mainz, Gerrmany) and can include the Schott PTR® 70 premium receivers which tackle the decomposition of known heat transfer fluids and accompanying hydrogen permeation into the vacuum of the receivers. These receivers are 4 meter long, 70 mm approximate diameter, and are set inside 125 mm outer diameter borosilicate glass with anti-reflective coatings to achieve a solar transmittance of approximately 97 percent. For each linear meter of 7.3 meter wide collector troughs, 7300 watts solar energy hitting the trough allows over 6000 watts to impinge upon the receiver tubes in full thermal mode. As configured and shown in FIG. 15, use of a capture element Y comprising a known cold mirror can provide spectrum splitting and this can allow for substantial solar energy being directed toward photovoltaic conversion. A 7.3 meter trough set up can generate in this manner over 500 watts of electrical energy per linear meter while still generating thermal energy. Preferred capture elements Y can be cold mirrors approximately 25 cm wide and approximately 30 cm from the focus of collector trough 10 which is at or near thermal collector T.

The instant invention comprises in part having the capture element is so formed, sized, shaped, positioned and oriented to be able to be selectively positioned within a short path length from a relative maximum in the concentrated angular distribution of light, as mentioned. This short path length preferably said short path length being of magnitude less than 0.45 of the focal length or delivery length associated with the collector trough; or more preferably, less than 0.25 of the focal or delivery length; or more preferably still, less than 0.15 the focal or delivery length. Advantages of this short path length include ease of manipulation, smaller needed mirror size, and better beam control, including optical alignment simplicity, and simplicity of targeting the photovoltaic receiver PV.

One of the control objectives using the instant invention can be to shift energy production intelligently on demand from thermal to photovoltaic. This can be done for any number of reasons, such as to prevent over-running or erratic or unsafe operation of the power producing turbines, or to extend the lifetime of the thermal tubes in thermal collector T. Excessive heating or too rapid heating of thermal collector parts can result in premature part failure, excessive wear, or fatigue. As an example, a major failure point in CSP plants is failure of the thermal tube inside the thermal collector. Thermal tube breakage results in loss of use of equipment, and with valving off, a reduction in output. Thermal tubes typically have to be welded in place, driving up costs. Failure mechanisms and modes include the inner tube of the thermal tube tends to sag, resulting in contact with the outer evacuated glass tube, typically causing the outer evacuated glass tube to break. By sensing when the inner tube begins to sag (such as through monitoring, or other sensor based mechanisms) the instant invention can be used to moderate temperatures and prevent breakage.

To achieve this, rather than adjust the tracking angle in a known manner as is done with conventional CSP systems, the invention can be used to shift the apportionment toward photovoltaic production immediately. For example, vertical multijunction photovoltaic receivers can be moved into the path of the solar flux thus blocking all the thermal generation on particular collectors specified by the site controller. Alternatively, a cold mirror can be positioned to divert a portion of the solar flux onto photovoltaic receivers PV maintaining a portion of solar flux for absorption by thermal collector T.

Figure 27:
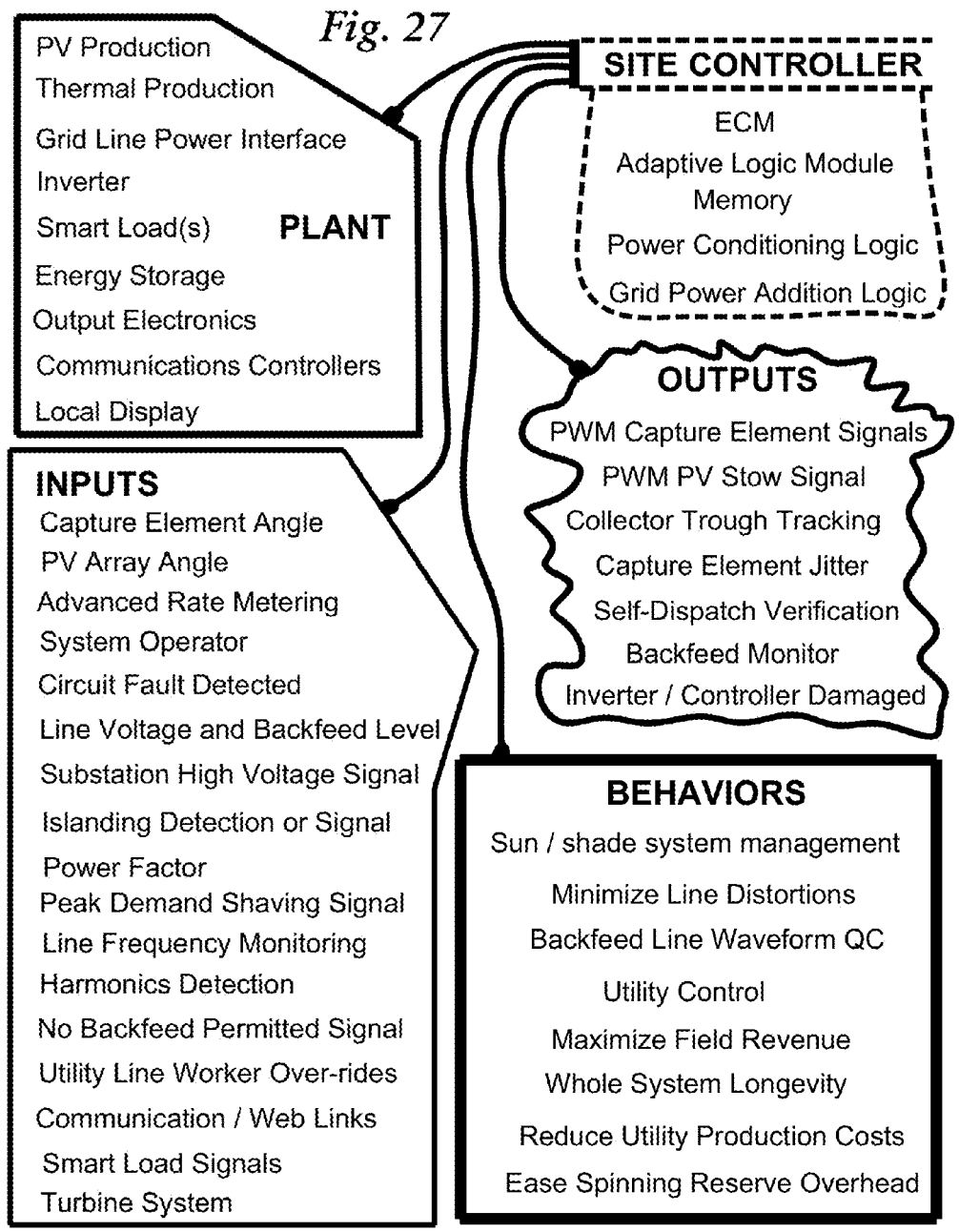
FIG. 27 shows a detailed rough schematic depicting possible elements, inputs, outputs and behaviors that can be embodied by a hybrid distributed photovoltaic/thermal energy conversion plant following the teachings of the instant invention.

Now referring to FIG. 27, a detailed rough schematic depicting possible elements, inputs, outputs and behaviors that can be embodied by a hybrid distributed photovoltaic/thermal energy conversion plant following the teachings of the instant invention is shown. A site controller, as defined in the Definitions section can be used to accomplish multiple engineering objectives using known engineering principles, software analysis and engineering and along with fine-tuning using empirical information that those skilled in the engineering arts can devise using the instant teachings. As illustratively shown, the SITE CONTROLLER interfaces with the hybrid distributed solar energy conversion plant (PLANT), receives various inputs (INPUTS) and produces various outputs (OUTPUTS), and can, using known engineering, exhibit various behaviors (shown, BEHAVIORS).

As shown, the site controller can comprise conventional known components such as an electronic control module (ECM), an Adaptive Logic Module to allow the system to learn from operating history; Memory; Power Conditioning Logic that allows for production of superior electrical waveforms produced for backfeed into electric utility transmission lines; and Grid Power Addition Logic which can help the ECM decide when and if to backfeed electrical power for purchase by the utility.

Sensors that can be employed using known technology include feedback sensors from inclinometers on trough arrays to give tracking angles and associated information; thermocouples and pressure sensors for monitoring steam production; electrical grid voltage and waveform sensors; thermal storage temperature sensors, and various fault sensors, including ground fault detection of electrical power produced, and measurement of solar incidence.

As can be contemplated by those skilled in the operational design arts, hybrid plant components can be in communication with the site controller, including communication with the PV Production components; Thermal Production components like thermal tubes, steam handling components, and turbines; Grid Line Power Interface components; the Inverter; any Smart Load(s) including co-generation receivables such as for building heating; Energy Storage as contemplated by the discussion associated with FIG. 10; and other known components such as Output Electronics; Communications Controllers; and any Local Display.

Possible inputs as shown include Capture Element Angle; PV Array Angle; Advanced Rate Metering; System Operator; Circuit Fault Detected; Line Voltage and Backfeed Level; Substation High Voltage Signal; Islanding Detection or Signal; Power Factor; Peak Demand Shaving Signal; Line Frequency Monitoring; Harmonics Detection; No Backfeed Permitted Signal; Utility Line Worker Over-rides; Communication/Web Links; Smart Load Signals; Turbine System, the nature, management and monitoring of which are known to those skilled in the engineering arts.

Possible outputs from the site controller include PWM Capture Element Signals which allow pulse width modulation signals to be sent to the capture elements Y; any PWM PV Stow Signal; Collector Trough Tracking; Capture Element Jitter signals which will be mentioned in the discussion for FIGS. 28 and 29 below; Self Dispatch Verification which can tell a local utility when and if the backfeed into that utility has operatively ceased; Backfeed Monitor which gives electrical waveform and quantity information for use by plant operator and electric utilities; and Inverter/Controller Damaged signals which information can be sent to an electric utility.

A method that can now be practiced by the instant invention, that allows operative control, in a fast, dynamic, verifiable way over the output and apportionment between photovoltaic and thermal conversion systems, including stowing of PV components and PV substitution for thermal conversion. Diversions that increase or decrease photovoltaic and/or thermal energy conversion can be now effected, by result of a site controller command decision that considers an input selected from any of an advanced rate metering input; a system operator input; a transactive signal; a circuit fault detection input; a line voltage input; a backfeed level input; a power grid substation high voltage signal; an islanding detection signal; a power factor level signal; a peak demand shaving signal; an electrical line frequency monitoring signal; a harmonics detection signal; a signal indicating that no power grid backfeeding is permitted; a utility line worker over-ride signal; a signal from a smart load fed at least selectively by said thermal collector; and a signal from a turbine system fed at least selectively by said thermal collector.

The result can be a set of desirable system behaviors that include Sun/shade system management effected by a logical system for dealing with solar variations; Minimize Line Distortions for electrical power backfed into an electric utility; Backfeed Line Waveform QC, which allows for better waveform quality; Utility Control which can allow for a utility to intervene, communicate with, or control certain system functions, allowing it, for example, to shut down PV production or shift it at will; Maximize Field Revenue from backfed power; Whole System Longevity which allows for longer component lifetimes; Reduce Utility Production Costs; and Ease Spinning Reserve Overhead at a local electric utility.

Figure 28:
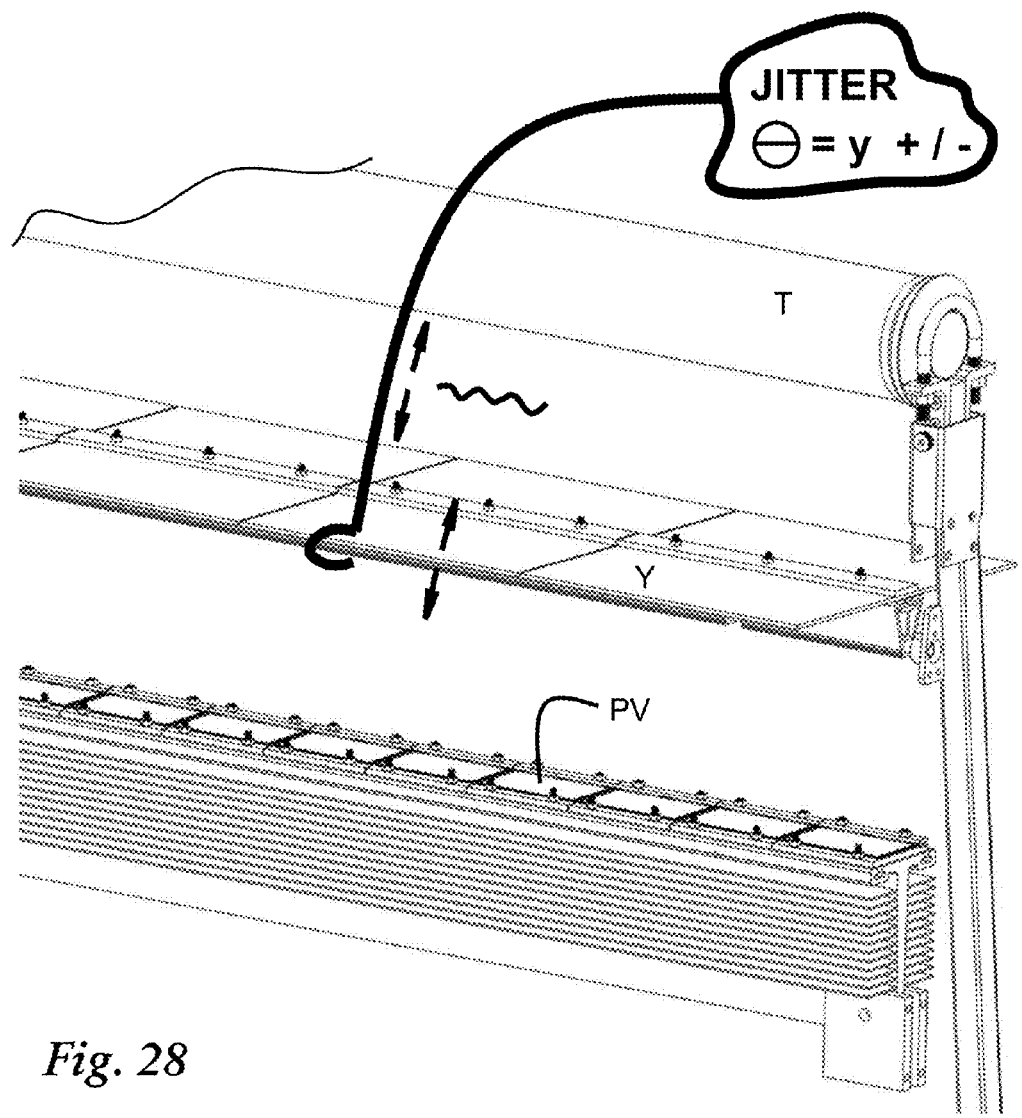
FIG. 28 shows a close-up oblique view similar to that of FIG. 13, with mechanical jitter imposed upon a capture element as taught by an additional embodiment of the invention.

To further assist such a system to act quickly and responsively to achieve these objectives, a mechanical jitter may be applied to capture element Y. FIG. 28 shows a close-up oblique view similar to that of FIG. 13, with mechanical jitter imposed upon a capture element as taught by an additional embodiment of the invention. FIG. 29 shows close-up side cross-sectional view of a capture element according to the invention similar to that shown in FIG. 6, with the capture element under the control of a site controller via a motive element administering mechanical jitter. Jitter can be applied to reduce the reaction time of the capture element Y and to synchronize any anticipated move with electrical line frequency. In a preferred embodiment, the mechanical jitter possesses at least one frequency selected from a fraction and a multiple of a power grid line frequency, including unity, namely, at the line frequency.

Now referring to FIGS. 30 and 31, close-up side cross-sectional views of a capture element according to the invention are shown similar to that shown in FIG. 6, with two-state glass exhibiting reflective and transmissive behaviors used by an alternative preferred embodiment taught by the instant invention. As mentioned, the capture element Y can be stationary and change state internally by using smart glass, a term used here to apply generaly to any material body or system, regardless of material composition, that allows for a change of state, or relative state, between transmission, and redirection or reflection of light or electromagnetic radiation. This can include known and future materials or systems employing liquid crystals, such as nematic systems; fluids containing filaments or orientable molecules; blind systems; shutters, and microblind systems which effect position changes in small structures. Microblinds, such as those researched and produced by the National Research Council, Canada are are very reflective, have high intensity ranges; possess millisecond response rates; constitute a neutral filter with no major frequency tint; are inorganic; and are stable in the presence of ultraviolet light and high temperatures.

As shown by the beams representing highly concentrated solar light 111, smart glass used as a capture element Y can allow very fast conversion from mostly reflective (REFLECT) to mostly transmissive (TRANSMIT) upon application of a signal, such as an electrical or other signal from the site controller, shown State signal. The state signal can be conveyed using known electrical, optical, electro-optical or other means using electrical conductors, optical fiber, or other signal transmission. Because of the microscopic nature of many phenomena that could be used to establish a reflective or transmissive state, little energy need be expended and response times can be swift enough to meet other objectives.

For example, as can be seen in FIGS. 32 and 33, a VARIABLE STATE CAPTURE ELEMENT can be utilized according to the invention. One illustrative way is shown, whereby an electrical, signal or other state-inducing jitter or jitter waveform is used to influence the transitioning between reflectivity and transmissivity to produce desired reflective and transmissive behaviors. Electrical, signal or other state-induced jitter is introduced to modulate a reflectivity variable R(t) as a function of time, while at the same time, out of phase, a transmissivity variable T(t), as shown. FIG. 32 is associated with the cartesian plot as shown, showing R(t) varying periodically over time, while FIG. 33 is associated with the cartesian plot as shown, showing T(t) varying periodically over time, Because these variations represent disposition of light arriving at capture element Y, conservation of energy requires that these jitters or variations occur out of phase, as shown when comparing the two plots. This can allow that reflected light from capture element Y can vary with time, and because photovoltaic receiver PV (not explicitly shown, off the page) is an electrical-optical device, this translates to a similarly induced varying electrical waveform. This can allow fast switching in a periodic or even an aperiodic manner to suit additional objectives, such as where the jitter is so imposed as to allow an electrical output from photovoltaic receiver PV that is at, or a multiple, or fraction of, the prevailing electric utility or power grid line frequency, e.g., 60 or 50 Hz.

This can allow for reduced costs, as the inverter required for electrical power backfeeding faces less of a processing burden or overhead, as the power generated in photovoltaic receiver PV is already set up to be similar to an electrical power waveform, albeit not yet inverted for every other half wave or peak.

The internal structure, either mechanical or molecular, can in fact be tuned to enhance or resonate with the electric utility line frequency. Electrical or other signal jitter can also help maintain responsiveness and reduce timing errors due to sluggish response that might otherwise set in for a system that is dynamically at rest for long periods. Those skilled in the art of signal processing will recognize that many additional objectives can be achieved to good effect, such as vacating the resultant electrical power production waveform from photovoltaic receiver PV to allow inverter accumulator or capacitor recovery or other electrical engineering prerogatives. The jitter can be varied in amplitude to allow a time-averaged apportioning between thermal collector T and photovoltaic receiver PV of any desired value, much as fuel mixture ratios in engine controls in the automotive industry employ a duty cycle jittered fuel ratio generating element such as a pintle or fuel injection pulse modulator.

Such a variable state capture element can formed to be used in conjunction with a capture element Y that comprises a photovoltaic receiver, such as to allow modulating how much light is received for photovoltaic conversion. Smart glass can be used for this purpose. This is reflected in the appended claims.

Those skilled in the art will also appreciate that such electrical or signal jitter can be varied from photovoltaic array to photovoltaic array, or from capture element to capture element, such as might be done to stagger output to meet electrical engineering objectives. Also those skilled in the signal processing arts can use any number of known signal generating components and circuits to drive capture element Y as given here.

If errors of phase are discovered by the site controller, such as where electricity production has a waveform character that has drifted in phase or other parameter to become unacceptable, the site controller can make almost instantaneous changes, well within a line frequency cycle, to correct the anomaly. This is very attractive to utilities as a component feature.

Figure 34:
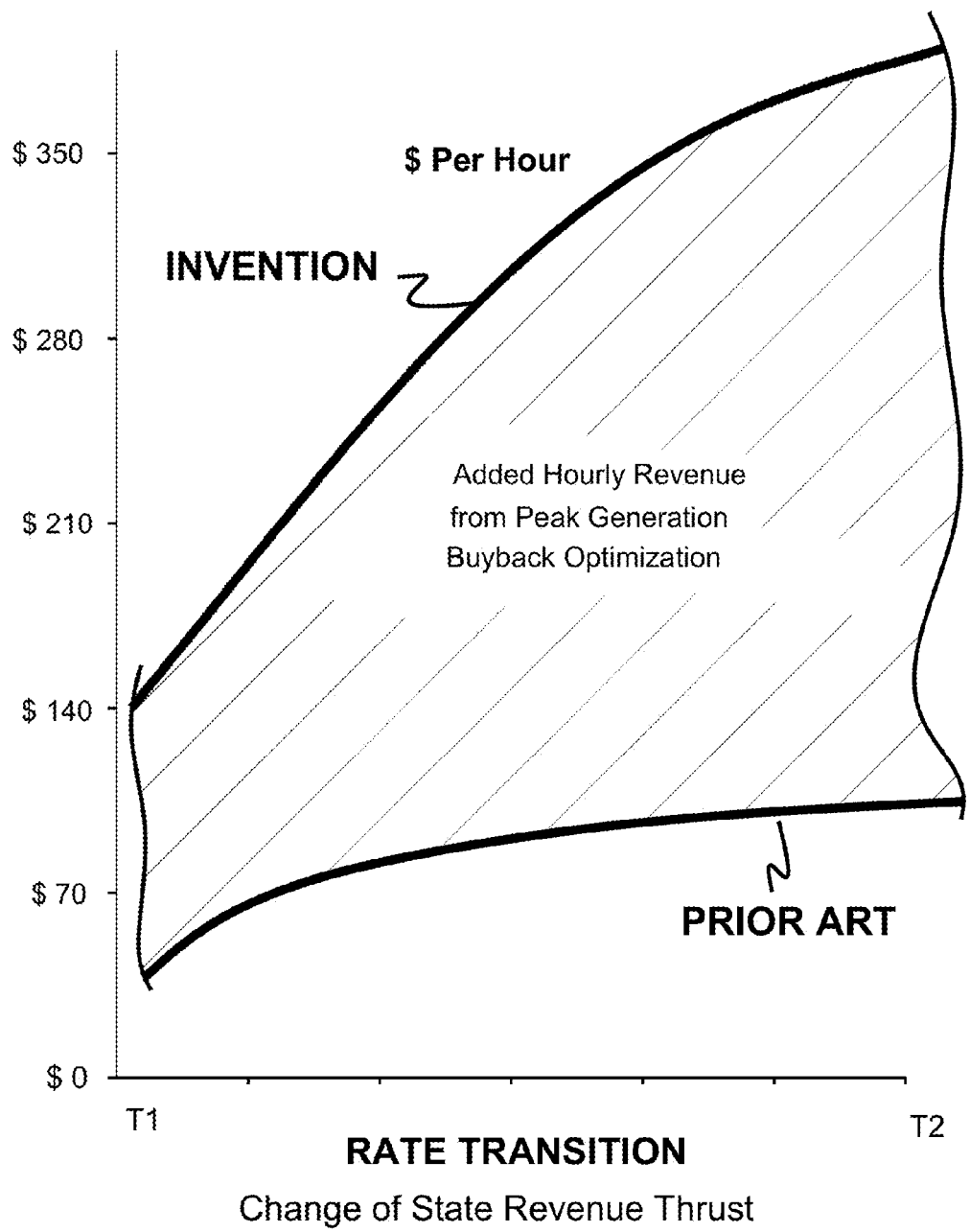
FIG. 34 shows a cartesian plot of added hourly revenue over a transitional time interval, demonstrating possible benefit from exploiting peak generation buyback from a power utility that is backfed energy using the hybrid photovoltaic/thermal power generation plant according to the invention.

FIG. 34 shows a cartesian plot of added hourly revenue over a transitional time interval, demonstrating possible benefit from exploiting peak generation buyback from a power utility that is backfed energy using the hybrid photovoltaic/thermal power generation plant according to the invention. During peak times when there can be higher payouts for backfed electrical power made by an electric utility, the teachings of the instant invention can be used to maximize electricity production to increase revenue, such as by allowing some amount of thermal energy conversion production to occur; supplementing this with further thermal production afforded by the thermal storage as listed in the discussion of the plant in FIG. 10; and producing, by changing apportionment, to favor photovoltaic energy conversion for direct electricity production, with such apportionment calcuated precisely for a maximum possible revenue stream; or by taking other more extreme steps. In the figure, transition between rates for buyback is occuring between times T1 and T2 as shown, for a critical time such as a late summer afternoon during unusually high electrical demand. Such pricing can be agreed upon beforehand and can be used by the utility to save on incremental generation asset startup and other costs. During this time, a conventional CSP plant is operating as shown on the lower curve, making modest adjustments that it is permitted to make, allowing revenue generated to pass from approximately $35 per hour to approximately $100 per hour. By contrast, in this example, a similar hybrid PV/T plant using the instant teachings and apparatus can make fast and significant changes to the PV/T mix, while drawing heat from thermal storage to maintain thermal production needed to feed the turbines. The change to the PV or photovoltaic portion of the energy conversion is almost instantaneous, and is already at $140 per hour, and can support conversion if necessary to all PV production while draining thermal storage fast to maximize electrical output by thermal production that feed turbines. The revenue rate as shown passes higher than $350 per hour. Even if this rate structure is only entertained by the utility on occasion for a short interval such as 40 minutes or 1.5 hours, the revenue can be significant and helpful for helping amortize a new hybrid distributed generation plant and making for profitability and acceptance.

Generally also, outside of high buyback rate periods, with the invention allowing use of cold mirrors to direct the portion of the spectrum that the VMJ solar cells convert at high efficiencies, while allowing other spectrum portions to be used for thermal production, the system can meet many objectives for better regulation and electric output regularity than are met by current CSP plants, enabling plant operators to shift electricity generating output to match peak demand rates, thus maximizing plant revenues.

Alternate embodiments can be created using the instant teachings that combine some of the attributes of the illustrative examples shown in FIGS. 21-25. Any optical device such as a mirror, lens, or treated surface can be used in service of the invention to redirect, or itself capture light—or both—upon selective demand, and using the teachings of the instant invention, become a capture element.

Figure 35:
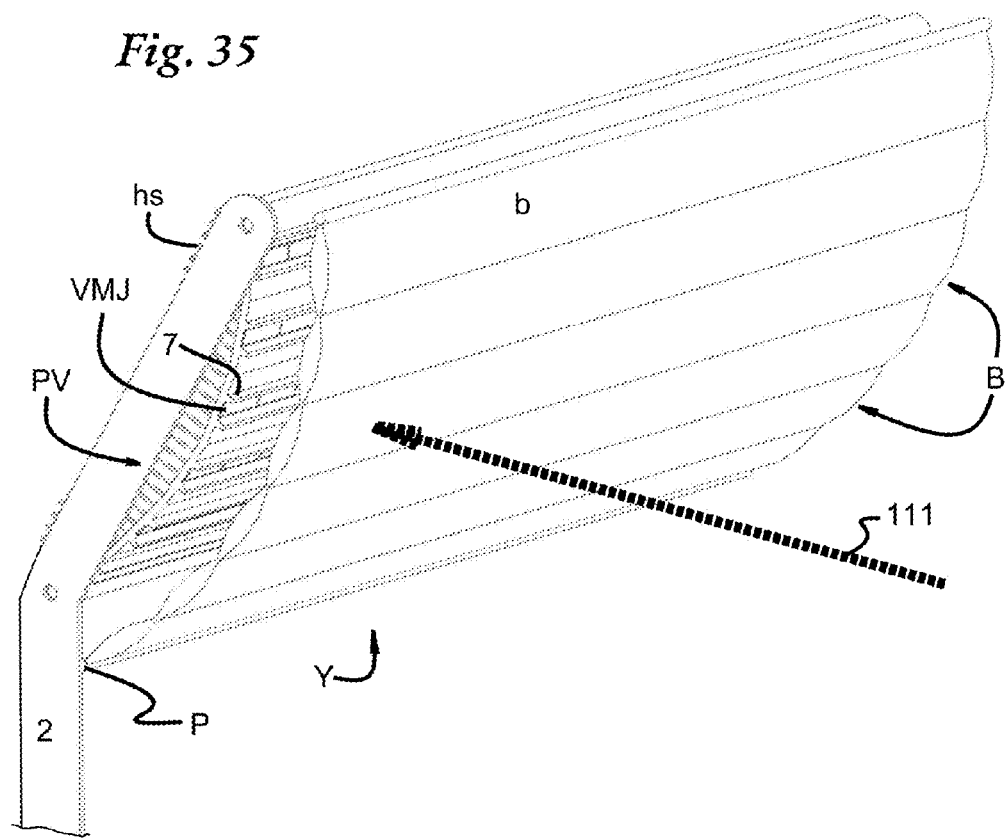
FIG. 35 shows an oblique surface view of a lens-assisted planetary capture element with a sub-concentrator according to the invention.

Now referring to FIG. 35, an oblique surface view of a alternate embodiment is shown, employing a lens-assisted planetary capture element Y with a sub-concentrator. Operatively affixed to a swing arm 2 as shown is photovoltaic receiver PV operatively similar to that illustratively shown in FIGS. 21 and 25, preferably comprising a plurality of vertical multijunction photovoltaic receivers VMJ mounted in a package or assembly which in turn can comprise a heat sink hs as shown for heat dissipation. This planetary capture element Y can rotate or orbit into position as will be further described. A lens array B comprising a plurality smaller elements such as lens b illustratively shown acts as a sub-concentrator to channel or concentrate highly concentrated solar light 111 to impinge efficiently and in a further concentrated manner upon an active portion of a vertical multijunction photovoltaic receiver VMJ. This can allow, for example, a small size 1×2 cm vertical multijunction photovoltaic receiver VMJ to receive a relatively larger portion of highly concentrated solar light 111 than would otherwise be received. Photovoltaic receiver PV can comprise waveguide 7 or other light sculpting or reflective surfaces to help channel light into vertical multijunction photovoltaic receiver VMJ.

Sub-concentrator lens array B can take many forms and can be of a structurally unitary design like that shown, such as an assembly formed in a unitary manner or from sub-assemblies that are fused or joined together, using known plastic, glass or other materials and using fabrication processes as those skilled in the art of optical devices can contemplate. Sub-concentrator lens array B can be mounted or mechanically affixed to swing arm 2 by a lens array pivot P. In this illustrative example, sub-concentrator lens array B is fixed with respect to the photovoltaic receiver PV that is part of capture element Y as shown.

Figure 36:
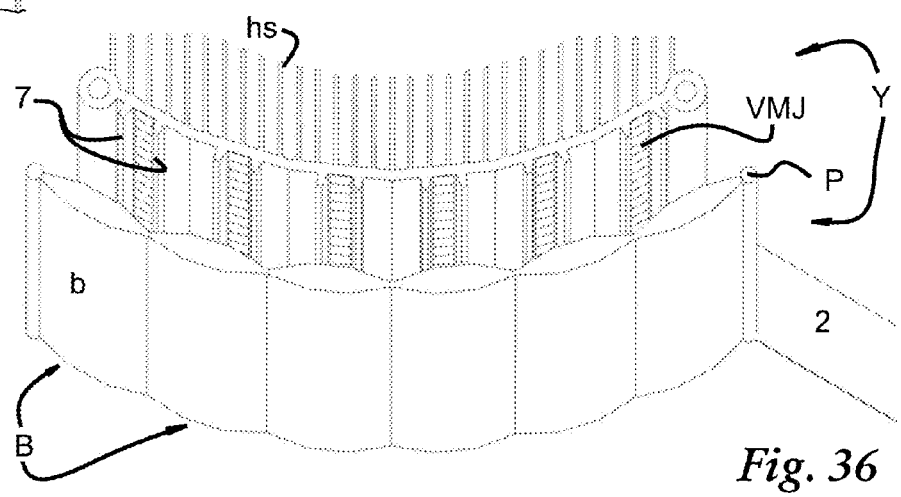
FIG. 36 shows a close-up of a portion of the lens-assisted planetary capture element depicted in FIG. 35.

FIG. 36 shows a close-up of a portion of the lens-assisted planetary capture element depicted in FIG. 35, from a side view that depicts sub-concentrator lens array B affixed to swing arm 2 using lens array pivot P, and positioned for optimum focusing to allow highly concentrated solar light 111 to be concentrated and channeled into vertical multijunction photovoltaic receivers VMJ with the assistance of a plurality of waveguides 7 as shown.

Figure 37:
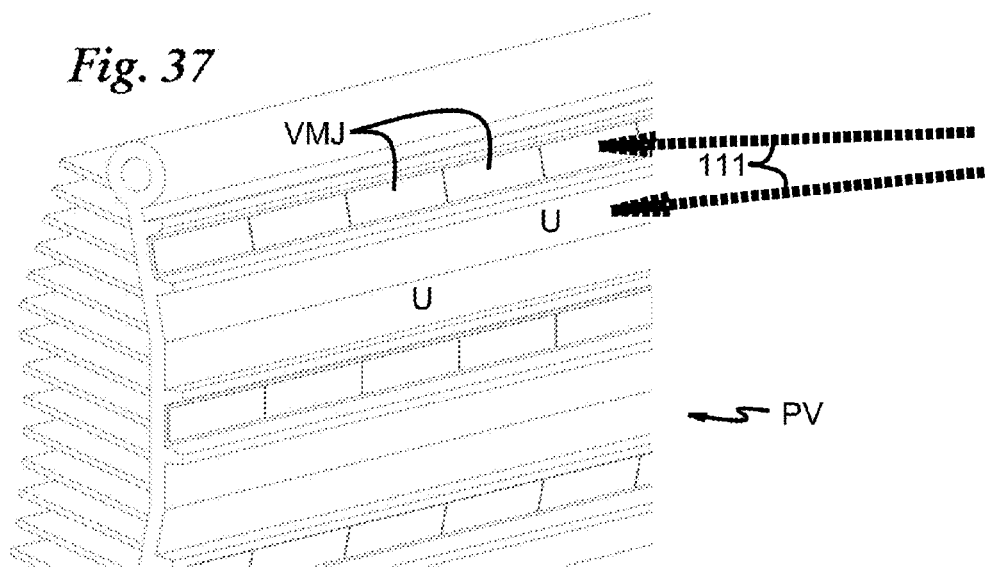
FIG. 37 shows a close-up oblique surface view of a photovoltaic receiver that can be employed with the lens-assisted planetary capture element of FIGS. 35 and 36, with vertical multijunction photovoltaic receivers shown illustratively to receive light from a sub-concentrator.
Figure 38:
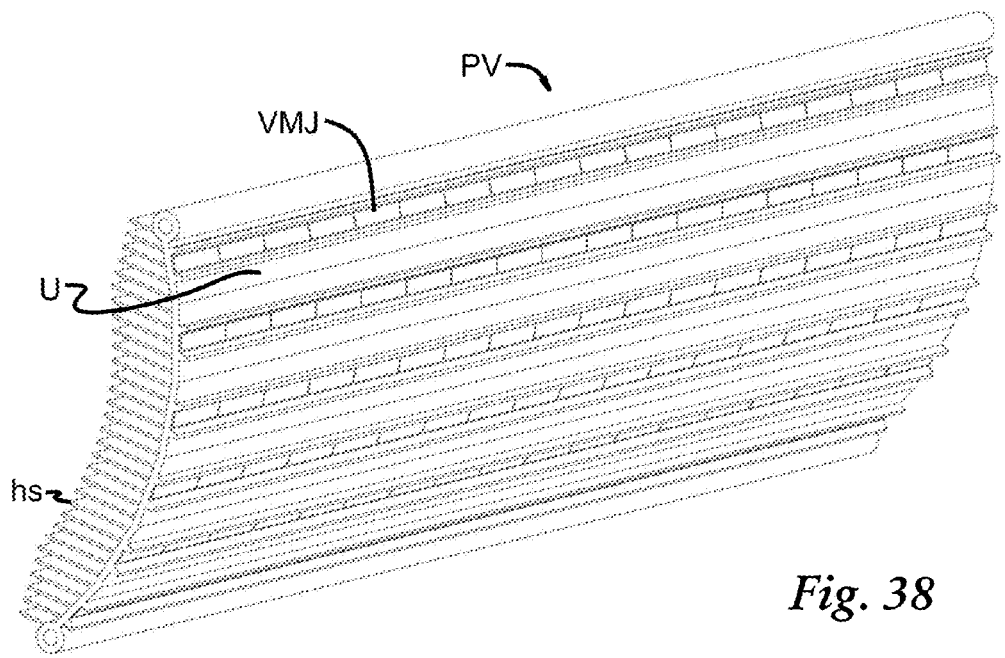
FIG. 38 shows a larger surface view of the photovoltaic receiver shown in FIG. 37.

Now referring to FIGS. 37 and 38, a close-up oblique surface views are shown of a photovoltaic receiver that can be employed with the lens-assisted planetary capture element Y of FIGS. 35 and 36, or an alternative embodiment using two capture elements. Photovoltaic receiver PV as shown comprises rows of vertical multijunction photovoltaic receivers VMJ as depicted, and shown between these rows of photovoltaic receivers are interstitial zones U. As shown, and as will be explained below, an alternative embodiment employing two capture elements can take rays of highly concentrated solar light 111 (shown, two rays) and redirect the rays to either vertical multijunction photovoltaic receivers VMJ (upper ray shown) or to interstitial zones U (lower ray shown). This will be shown in FIGS. 41 and 42.

Now referring to FIG. 39, a partial cross-sectional, partial surface view of a hybrid energy conversion system using the planetary capture element Y with sub-concentrator lens array B is shown, continuing the description of FIGS. 35-38. Collector trough 10, shown partially, is so formed, shaped, positioned and oriented to form highly concentrated solar light 111, whose rays illustratively shown impinge upon thermal collector T and also upon planetary capture element Y, which is a single capture element because sub-concentrator lens array B is fixed with respect to photovoltaic receiver PV and thus acts as a simple sub-concentrator only. Planetary capture element Y comprises photovoltaic receiver PV which is swingingly mounted on swing arm 2, in turn affixed using known mechanical components to support W using structure not shown for clarity. Planetary capture element Y is formed, sized, positioned, shaped and affixed in such a way to allow it to swing down and to the right on the page, in a manner similar to that shown in previous figures, and suggested in the alternative embodiment of FIG. 41. FIG. 40 shows the same type of partial cross-sectional, partial surface view of the hybrid energy conversion system as in FIG. 39, but shown in a smaller scale, but with the planetary capture element Y swung into an inactive or stow position near a base of support W and proximate collector trough 10. In this position, the hybrid energy conversion system of this embodiment is in a thermal only mode similar to that previously depicted in FIGS. 21, 23, and 24.

Now referring to FIGS. 41 and 42, an alternative preferred embodiment will be illustratively shown which uses two capture elements. In particular, this shall illustrate how an optical element such as sub-concentrator lens array B in service of the instant invention can be manipulated intelligently upon selective demand and become functionally a capture element used to practice the invention.

FIG. 41 shows a partial cross-sectional, partial surface close-up side view of the top of a different hybrid energy conversion system using the planetary capture element with sub-concentrator lens array B, similar to that depicted in FIGS. 35-40, but with the sub-concentrator lens array B now moveably and rotatably mounted on lens array pivot P to allow a rotation r as shown. This rotation is similar in overall direction to a similar rotation that which can be produced by the planetary capture element, now labeled Y1.

Planetary capture element Y1, itself rotatably mounted on swing arm 2 off capture element swing arm pivot 20 (not shown) can function as a capture element. But an added mechanical degree of freedom is now added by allowing that lens array B can itself, too, rotate, and can cause a diversion of light to or from vertical multijunction photovoltaic receivers VMJ. This causes sub-concentrator lens array B to become, as an optical device or lens, a second articulatable sub-concentrator capture element Y2 as depicted. In this embodiment, the energy received by photovoltaic receiver PV can be modulated by both planetary capture element Y1 and articulatable sub-concentrator capture element Y2.

Now referring to FIG. 42, a close-up cross-sectional view is shown of the planetary capture element Y1 and articulatable sub-concentrator capture element Y2 in two different states, with two different positions of the now articulatable sub-concentrator capture element Y2 pictorially super-imposed upon one another. As shown, photovoltaic receiver PV is supported and articulatable by swing arm 2 and comprises heat sink hs, vertical multijunction photovoltaic receiver VMJ, waveguides 7, and interstitial zones U as previously shown. This collectively forms planetary capture element Y1. Pivoting off swing arm 2 as shown is articulatable sub-concentrator capture element Y2, which comprises sub-concentrator lens array B. In a first state, sub-concentrator lens array B is in a first position, depicted as articulatable sub-concentrator capture element Y2. In a second state, articulatable sub-concentrator capture element Y2 and associated sub-concentrator lens array B are rotated to a new angular position, depicted as Y2'. In the first state (Y2), highly concentrated solar light 111 shown in the ray on the right passes through a lens b and impinges directly upon vertical multijunction photovoltaic receiver VMJ. In the second state, highly concentrated solar light 111 passes through a lens b with the sub-concentrator lens array B rotated (Y2') and this light is caused to divert to impinge upon interstitial zone U as shown. This change in the position of articulatable sub-concentrator capture element Y2 can, as previously described, be effected by a motive element (not shown) under the command of the Site Controller (not shown). The changes of state produced by planetary capture element Y1 can be independent of those produced by articulatable sub-concentrator capture element Y2.

By design, the light spots created by allowing highly concentrated solar light 111 to impinge upon one or more interstitial zones U can be simply reflected, passing back to collector trough 10 or elsewhere; or can pass through a hollowed out portion of waveguide 7 and heat sink hs (not shown), possibly to continue onward toward thermal collector T as shown in previous FIG. 41. Alternatively, interstitial zones U can comprise a different type of photovoltaic receiver (not shown). The two capture elements Y1 and Y2 can work in concert to achieve desired engineering objectives, including faster dynamic velocity of the change of light intensity upon a photovoltaic receiver. Those skilled in the engineering arts will appreciate that many possible schemes are permitted using the capture elements and teachings of the instant invention.

Generally, it should be noted that all functional blocks and diagrammatic items illustratively shown and described can be physically and often temporally and temporarily distributed. Those skilled in the art can appreciate that the systems as contemplated here can take additional steps without departing from the invention, such as fine changes in collector trough tracking angle; introducing other solar light, such as a boost system; re-directing, reflecting or blocking mechanisms not contemplated in the illustrative embodiments shown herein, and other enhancements without departing from the scope of the invention. Also, one can substitute manual control for any or all of the automatic control items suggested by way of illustration for those skilled in the art.

Other optical elements can be interposed between the elements of the appended claims without departing from the scope of the invention, as those skilled in the art can add desired functional steps or elements to serve needed ends in a particular application.

For example, the collector trough reflector component(s) themselves can comprise frequency discriminators such as a cold mirror, etc., possibly with photovoltaic cells underneath. Curved or other focusing geometries can be employed in capture element Y to as to offload light intended for a photovoltaic receiver to some distance additional to that illustratively shown, and this can allow the photovoltaic receiver to be located almost anywhere, including under the collector trough itself, such as through an optical via, without departing from the invention as disclosed and claimed.

All of the elements as taught and claimed can be under an enclosure, lens, canopy, fluid or light-transmitting body without departing from the scope of the invention, as those skilled in the art may elect to protect, amplify, modify, or create in an alternative fashion a concentrated angular distribution of light as taught in this disclosure.

Further steps can be used by future technologies allowing apportioning between solar conversion devices optimized for different light or radiation frequencies without departing from the scope of the invention. Nothing in these teachings or description shall prevent the use of stationary, fixed state capture elements to help produce a hybrid distributed energy conversion system. The components as shown and described here can be used in a manner that allows for the capture element to be a static component, possibly in combination with similar non-sttic components.

Other systems and elements can be added without detracting from the method.

There is obviously much freedom to exercise the elements or steps of the invention. The description is given here to enable those of ordinary skill in the art to practice the invention. Many configurations are possible using the instant teachings, and the configurations and arrangements given here are only illustrative.

Those with ordinary skill in the art will, based on these teachings, be able to modify the invention as shown.

The invention as disclosed using the above examples may be practiced using only some of the optional features mentioned above. Also, nothing as taught and claimed here shall preclude addition of other reflective structures or optical elements.

Obviously, many modifications and variations of the present invention are possible in light of the above teaching. It is therefore to be understood that, within the scope of the appended claims using the Definitions given above, the invention may be practiced otherwise than as specifically described or suggested here.

We claim:

1. A hybrid energy conversion system for apportioning concentrated solar radiation in real time upon selective intelligent demand between a plurality of solar energy conversion devices, including a photovoltaic receiver, said system comprising:
    a collector trough so sized, positioned, oriented and shaped to concentrate said solar radiation and create a concentrated angular distribution of light, said concentrated angular distribution of light possessing at least one of a focal length and a delivery length, as measured from a surface of said collector trough to a relative maximum of highly concentrated solar light formed thereby;
    a first solar energy conversion device selected from a thermal collector, and said photovoltaic receiver, so formed, sized, shaped, positioned and oriented to receive at least some of said solar radiation from said collector trough via said highly concentrated solar light in said concentrated angular distribution of light; and
    a selectively deployable capture element so formed, sized, shaped, positioned and oriented to capture selectively on demand at least some of said concentrated angular distribution of light for any of reflection to, partial reflection to, direction to, and conversion by, a second solar energy conversion device selected correspondingly from the other of said photovoltaic receiver and said thermal collector,
    wherein said capture element is selectively deployable for light capture by rotating and translating the selectively deployable capture element with respect to the collector trough, the rotation and translation occurring to, from, or within a space between said thermal collector and said collector trough.

2. The hybrid energy conversion system of claim 1, wherein said capture element is so formed, sized, shaped, positioned and oriented to be able to be selectively positioned within a short path length from said relative maximum in said concentrated angular distribution of light, said short path length being of magnitude less than 0.45 of said one of said focal length and said delivery length associated with said collector trough.

3. The hybrid energy conversion system of claim 2, wherein said short path length is of magnitude less than 0.25 of said one of said focal length and said delivery length associated with said collector trough.

4. The hybrid energy conversion system of claim 2, wherein said short path length is of magnitude less than 0.15 of said one of said focal length and said delivery length associated with said collector trough.

5. The hybrid energy conversion system of claim 1, wherein said capture element so operatively positioned to deliver upon said second solar energy conversion device a deflected highly concentrated solar light.

6. The hybrid energy conversion system of claim 1, wherein said photovoltaic receiver comprises at least one multijunction photovoltaic cell.

7. The hybrid energy conversion system of claim 1, wherein said photovoltaic receiver comprises at least one vertical multijunction photovoltaic cell.

8. The hybrid energy conversion system of claim 1, wherein said capture element is so formed to capture said concentrated angular distribution of light sufficiently to cause substantially all solar light incident upon it to be deflected to said second solar energy conversion device.

9. The hybrid energy conversion system of claim 1, wherein said thermal collector is a thermal tube positioned substantially near said focal length of said collector trough.

10. The hybrid energy conversion system of claim 1, wherein said capture element is further selectively deployable for light capture by transitioning a reflectivity or transmissivity of said capture element.

11. The hybrid energy conversion system of claim 10, wherein said capture element comprises smart glass so operatively formed and positioned to allow said transitioning.

12. A hybrid energy conversion system for apportioning concentrated solar radiation in real time upon selective intelligent demand between a plurality of solar energy conversion devices, including a photovoltaic receiver, said system comprising:
   a collector trough so sized, positioned, oriented and shaped to concentrate said solar radiation to create a concentrated angular distribution of light, said concentrated angular distribution of light possessing at least one of a focal length and a delivery length, as measured from a surface of said collector trough to a relative maximum of highly concentrated solar light formed thereby;
   a first solar energy conversion device selected from a thermal collector, and said photovoltaic receiver, so formed, sized, shaped, positioned and oriented to receive at least some of said solar radiation from said collector trough via said highly concentrated solar light in said concentrated angular distribution of light;
   a selectively deployable capture element so formed, sized, shaped, positioned and oriented to capture selectively on demand at least some of said concentrated angular distribution of light for conversion by a second solar energy conversion device selected correspondingly from the other of said photovoltaic receiver and said thermal collector, said capture element comprising operatively said second solar energy conversion device;
   wherein said capture element is selectively deployable for light capture by rotating and translating the selectively deployable capture element with respect to the collector trough, the rotation and translation occurring to, from, or within a space between said thermal collector and said collector trough.

13. The hybrid energy conversion system of claim 12, wherein said capture element is so formed, sized, shaped, positioned and oriented to be able to be selectively positioned within a short path length from said relative maximum in said concentrated angular distribution of light, said short path length being of magnitude less than 0.45 of said one of said focal length and said delivery length associated with said collector trough.

14. The hybrid energy conversion system of claim 12, wherein said short path length is of magnitude less than 0.25 of said one of said focal length and said delivery length associated with said collector trough.

15. The hybrid energy conversion system of claim 12, wherein said short path length is of magnitude less than 0.15 of said one of said focal length and said delivery length associated with said collector trough.

16. The hybrid energy conversion system of claim 12, wherein said photovoltaic receiver comprises at least one multijunction photovoltaic cell.

17. The hybrid energy conversion system of claim 12, wherein said photovoltaic receiver comprises at least one vertical multijunction photovoltaic cell.

18. The hybrid energy conversion system of claim 12, wherein said thermal collector is a thermal tube positioned substantially near said focal length of said collector trough.

19. The hybrid energy conversion system of claim 12, wherein said capture element is further selectively deployable for light capture by transitioning a reflectivity or transmissivity of said capture element.

20. A hybrid energy conversion system comprising:
   a support having two ends;
   a heat sink support mounted to and extending between the two ends;
   a photovoltaic receiver mounted to the heat sink support;
   a thermal tube collector mounted to and extending between the two ends above the heat sink support and the photovoltaic receiver;
   a collector trough located below the photovoltaic receiver at a distance from the thermal tube collector, the distance being a focal length of solar radiation reflected by the collector trough toward the thermal tube collector;
   a pivoting rotatable arm mounted to the support; and
   a selectively deployable capture element, the heat sink support, and the photovoltaic receiver mounted to the rotatable arm, the selectively deployable capture element having a transitionable reflectivity or transmissivity,
   wherein, the selectively deployable capture element is configured to:
      pivot between a position below or next to the thermal tude collector and a position next to the collector trough in response to movement of the rotatable arm,
      rotate about an axis extending between the two ends of the support, and
      translate along an axis extending between the photovoltaic receiver and the thermal tube collector.

21. The hybrid energy conversion system of claim 20, wherein the selectively deployable capture element is selectively positioned at a distance from the thermal tube collector that is less than 0.15 of the focal length of solar radiation reflected by the collector trough toward the thermal tube collector.

22. The hybrid energy conversion system of claim 20, wherein the photovoltaic receiver comprises at least one multijunction photovoltaic cell.

23. The hybrid energy conversion system of claim 20, wherein the photovoltaic receiver comprises at least one vertical multijunction photovoltaic cell.

24. The hybrid energy conversion system of claim 20, wherein the selectively deployable capture element comprises smart glass configured to provide said transitioning.

* * * * *